United States Patent
Sakai et al.

(10) Patent No.: US 8,770,723 B2
(45) Date of Patent: *Jul. 8, 2014

(54) PIEZOELECTRIC ELEMENT, LIQUID EJECTING HEAD, AND LIQUID EJECTING APPARATUS

(75) Inventors: Tomohiro Sakai, Chino (JP); Koichi Morozumi, Shiojiri (JP); Tsutomu Asakawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/295,326

(22) Filed: Nov. 14, 2011

(65) Prior Publication Data

US 2012/0120161 A1 May 17, 2012

(30) Foreign Application Priority Data

Nov. 16, 2010 (JP) .................... 2010-255589
Jun. 2, 2011 (JP) .................... 2011-124657

(51) Int. Cl.
*B41J 2/045* (2006.01)
*H01L 41/00* (2013.01)
*H02N 2/00* (2006.01)

(52) U.S. Cl.
USPC ........................... 347/68; 310/311

(58) Field of Classification Search
None
See application file for complete search history.

(56) References Cited

U.S. PATENT DOCUMENTS

| 8,212,451 | B2 | 7/2012 | Inagaki et al. | |
|---|---|---|---|---|
| 2009/0243438 | A1* | 10/2009 | Hamada et al. | ............... 310/358 |
| 2010/0231095 | A1 | 9/2010 | Kubota et al. | |
| 2011/0226634 | A1 | 9/2011 | Bhavaraju | |

FOREIGN PATENT DOCUMENTS

| CN | 101536203 | 9/2009 |
|---|---|---|
| EP | 2145975 | 1/2010 |
| EP | 2262020 | 12/2010 |
| JP | 11-145412 | 5/1999 |
| JP | 2001-223404 | 8/2001 |
| JP | 2009-252789 | 10/2009 |
| WO | 2010/013438 | 2/2010 |

OTHER PUBLICATIONS

European Search Report for European Patent Application No. 11188950.7 dated Feb. 10, 2014.

* cited by examiner

*Primary Examiner* — Matthew Luu
*Assistant Examiner* — Erica Lin
(74) *Attorney, Agent, or Firm* — Workman Nydegger

(57) ABSTRACT

A piezoelectric element comprises a electrode and a piezoelectric layer made of a complex oxide having a perovskite structure containing at least bismuth, barium, iron, and titanium. A layered compound containing iron, barium, titanium and oxygen is formed between the piezoelectric layer and the electrode.

8 Claims, 30 Drawing Sheets

PORTION a 50 nm

PORTION b 50 nm

PORTION c 50 nm

PORTION d 50 nm

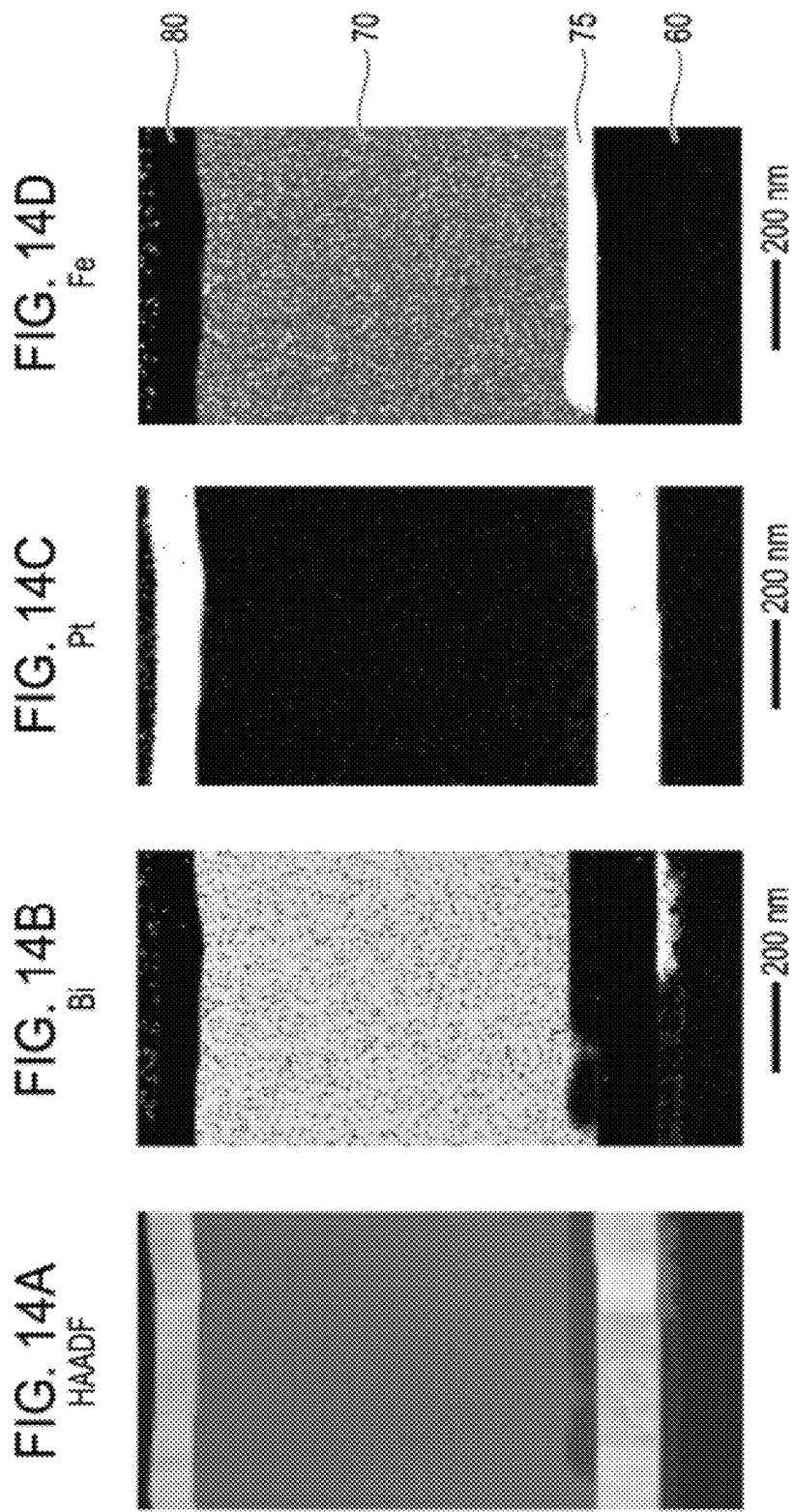

O

Ti

Ba

Mn

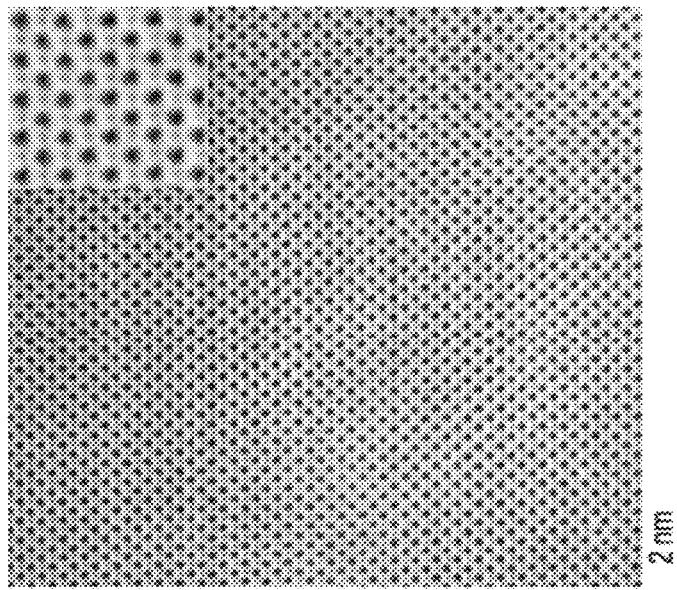
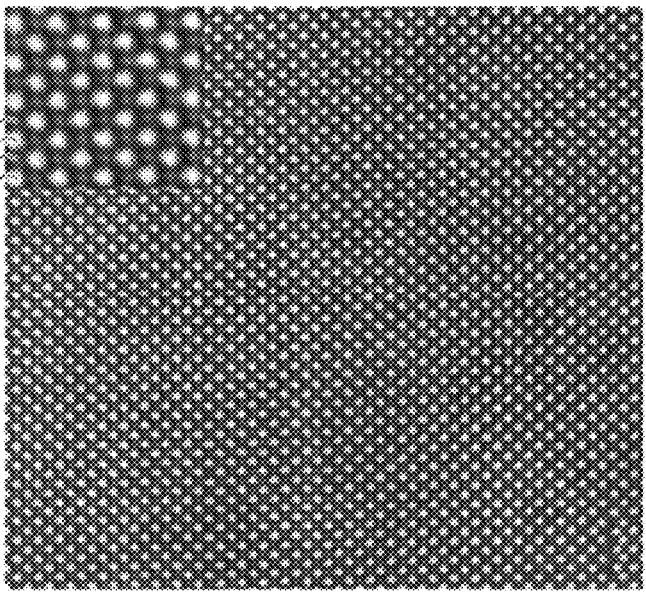
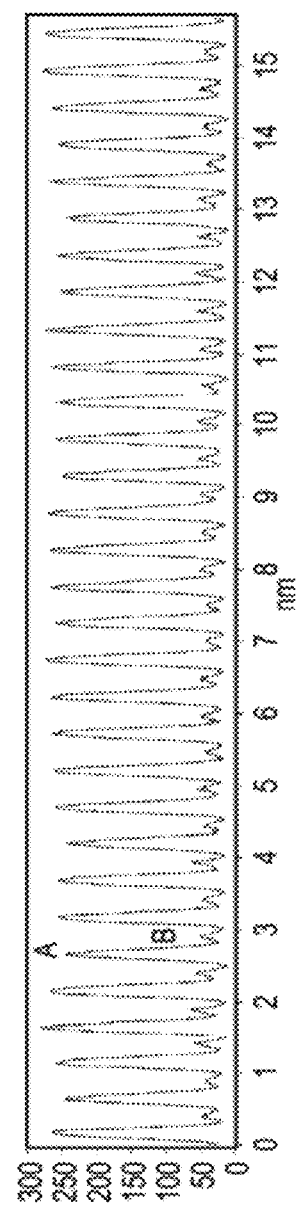
FIG. 15A
FIG. 15B
FIG. 15C

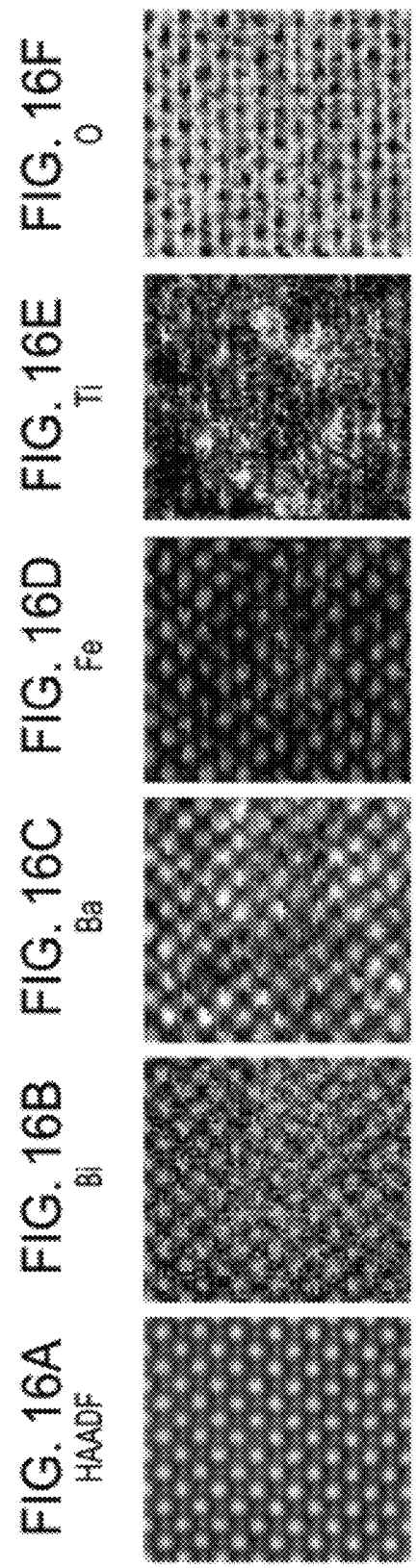

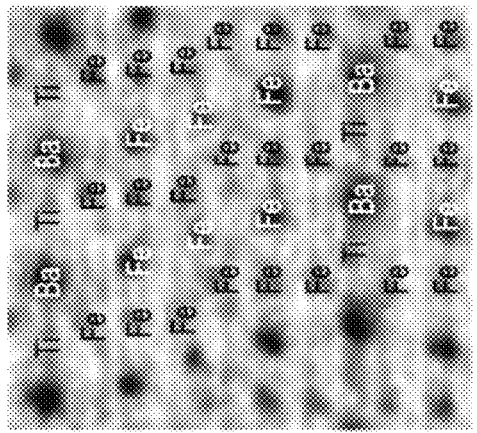
FIG. 18B
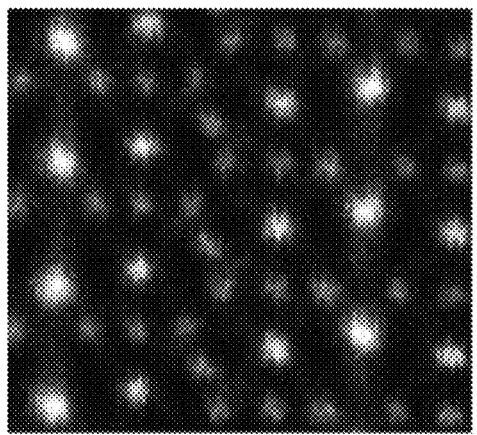
FIG. 18A
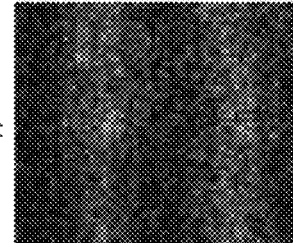
FIG. 18G
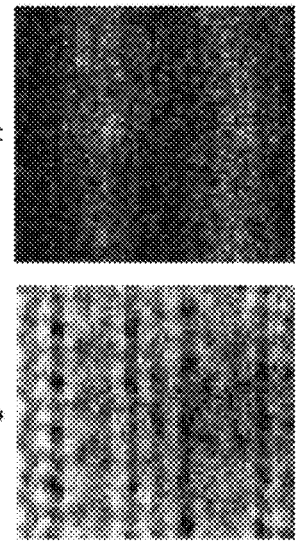
FIG. 18F
FIG. 18E
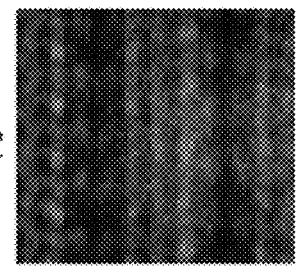
FIG. 18D
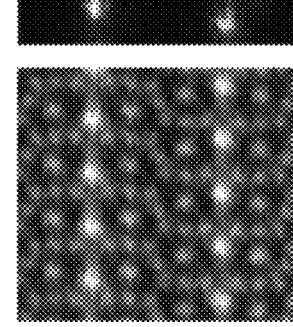
FIG. 18C PORTION a PORTION b PORTION c PORTION d

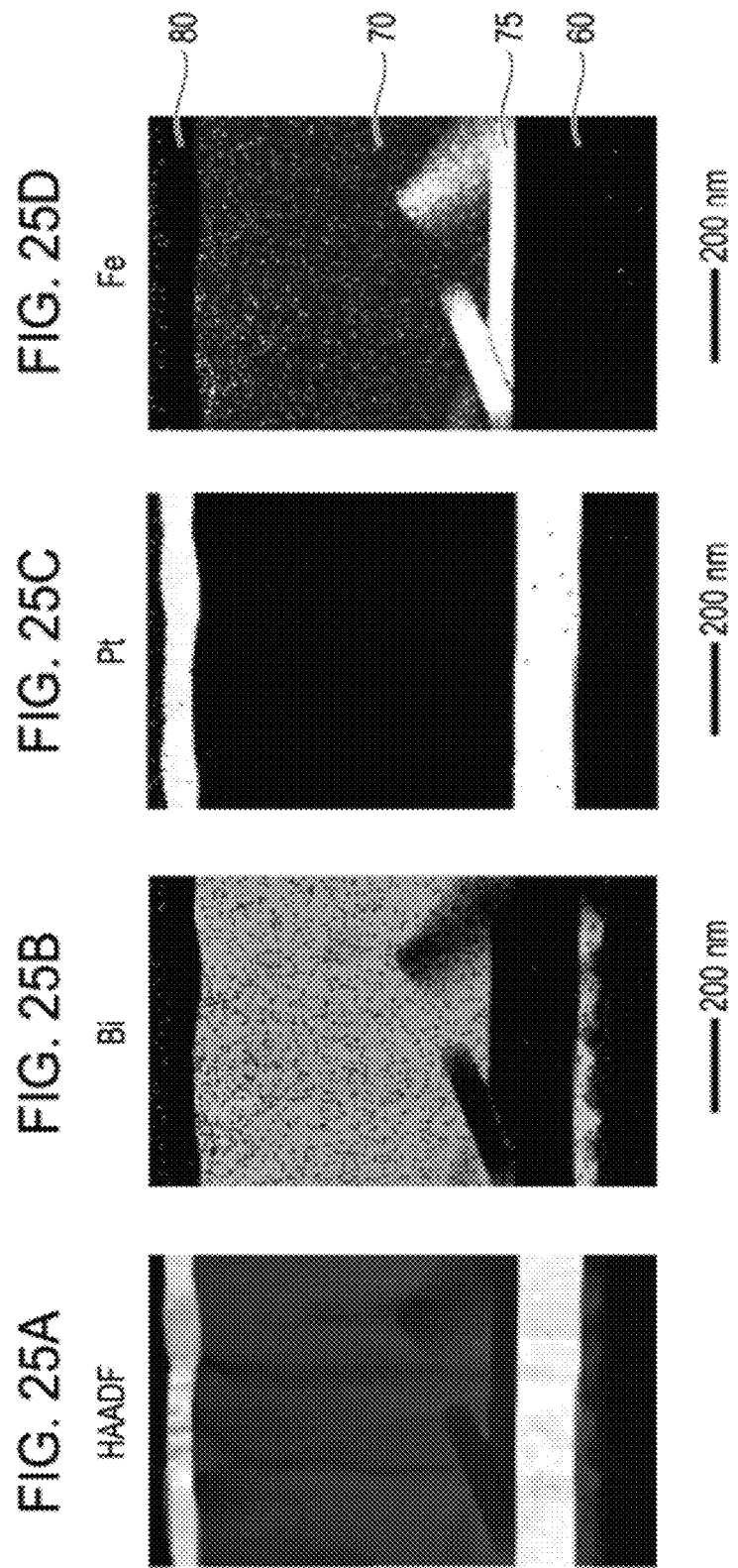

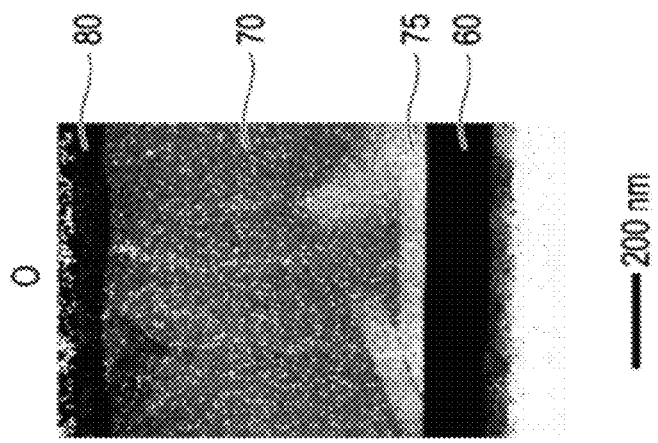
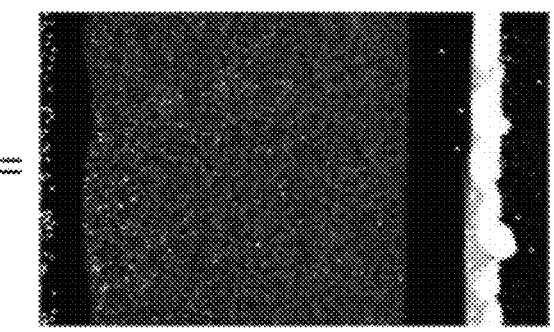
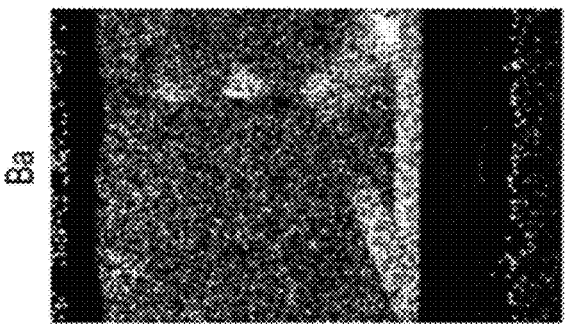
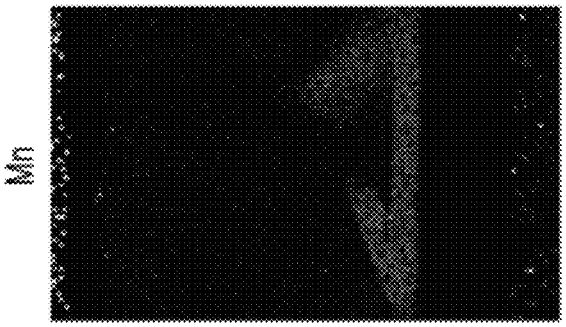

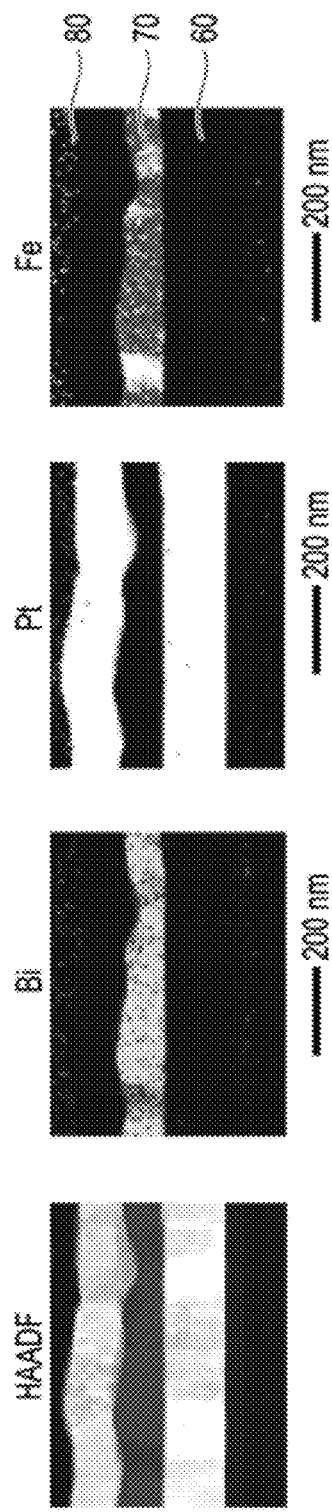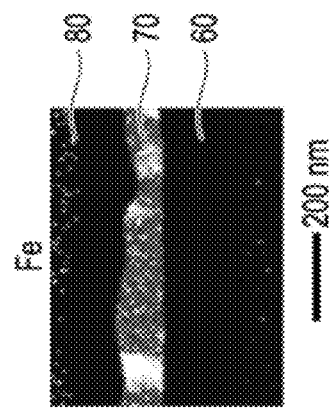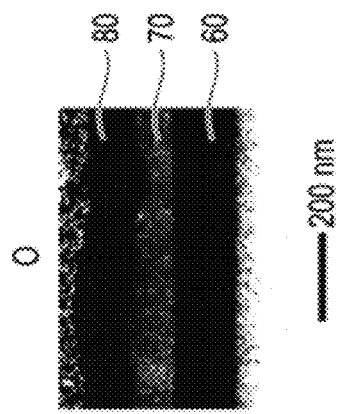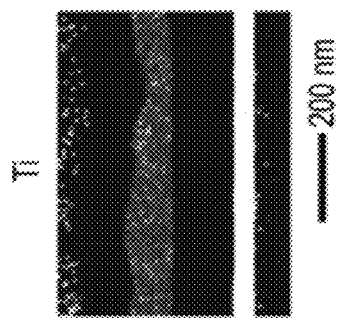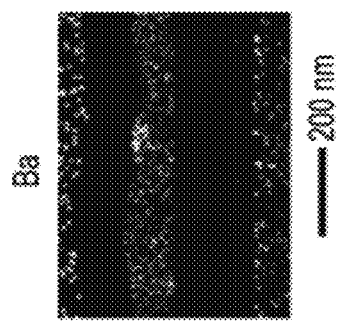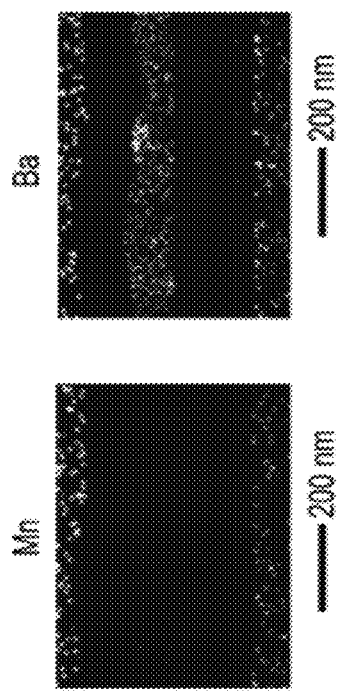
FIG. 27A HAADF
FIG. 27B Bi
FIG. 27C Pt
FIG. 27D Fe
FIG. 27E Mn
FIG. 27F Ba
FIG. 27G Ti
FIG. 27H O

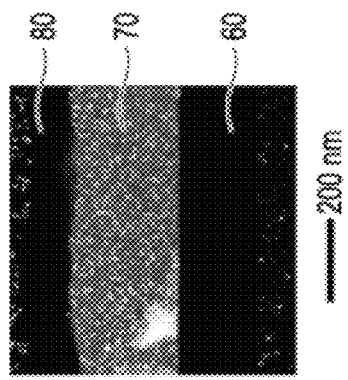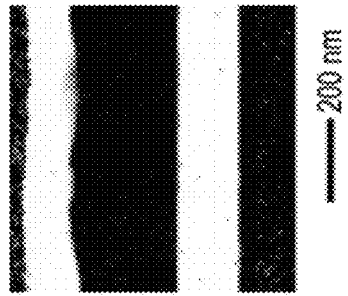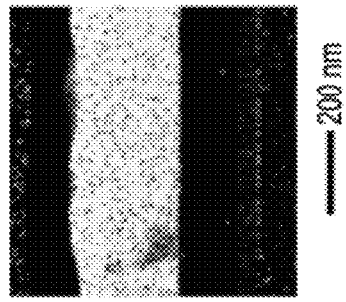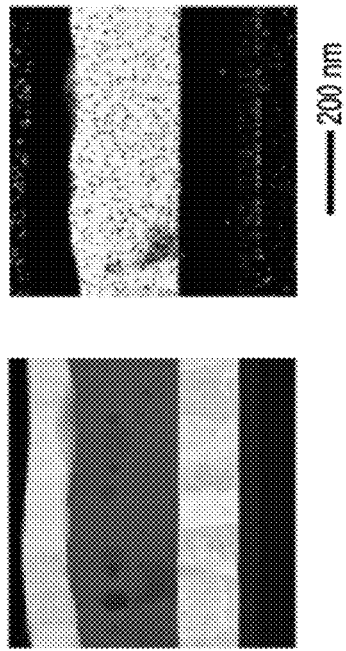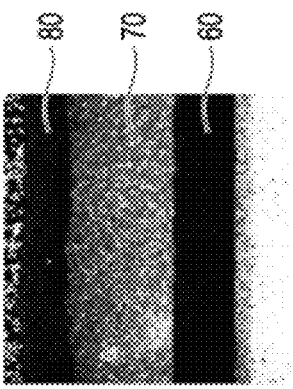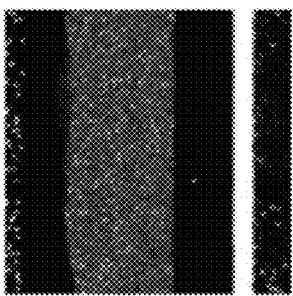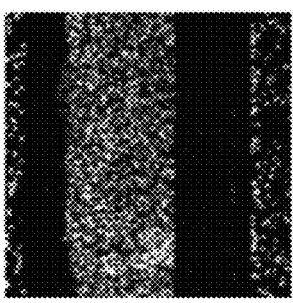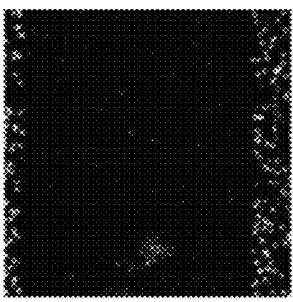

PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2010-255589, filed Nov. 16, 2010 and Japanese Patent Application No. 2011-124657, filed Jun. 2, 2011 are expressly incorporated by reference herein.

BACKGROUND

1. Technical Field

The present invention relates to a liquid ejecting head and a liquid ejecting apparatus that each include a pressure generating chamber communicating with a nozzle aperture, and a piezoelectric element changing the pressure in the pressure generating chamber and including a piezoelectric layer and electrodes applying a voltage to the piezoelectric layer, and to the piezoelectric element.

2. Related Art

Some of the piezoelectric elements have a structure in which a piezoelectric layer made of a piezoelectric material capable of electromechanical conversion, such as a crystallized dielectric material, is disposed between two electrodes. This type of piezoelectric element can be used as a deflection vibration mode actuator device in a liquid ejecting head. Ink jet recording heads are a typical type of liquid ejecting head. An ink jet recording head includes a vibration plate defining a part of a pressure generating chamber communicating with a nozzle aperture through which ink droplets are ejected. In the ink jet recording head, a piezoelectric element deforms the vibration plate to apply a pressure to the ink in the pressure generating chamber, thereby ejecting ink droplets through the nozzle aperture.

The piezoelectric material (piezoelectric ceramic) used for forming the piezoelectric layer of such a piezoelectric element is required to have high piezoelectric properties, and a typical example of the piezoelectric material is lead zirconate titanate (PZT) (see JP-A-2001-223404). On the other hand, it is desired to reduce lead from piezoelectric materials, from the viewpoint of environmental protection. For example, $BiFeO_3$-based piezoelectric materials, which contain Bi and Fe, are lead-free. Among these are piezoelectric materials containing mixed crystals of $Bi(Fe, Mn)O_3$ and $BaTiO_3$ (see JP-A-2009-252789).

Since the piezoelectric element used in such an ink jet recording head or the like is repeatedly operated while causing displacement, the piezoelectric layer is subject to the risk of separating from the electrodes. This issue arises not only in ink jet recording heads that eject ink droplets, but also in other liquid jet heads that eject droplets other than ink.

SUMMARY

Accordingly, an advantage of some aspects of the invention is that it provides a liquid ejecting head and a liquid ejecting apparatus that each include a piezoelectric element in which the electrodes and the piezoelectric layer have a high adhesion therebetween, and provides such a piezoelectric element.

According to an aspect of the invention, a liquid ejecting head is provided which includes a pressure generating chamber communicating with a nozzle aperture, and a piezoelectric element. The piezoelectric element includes a platinum first electrode, a piezoelectric layer made of a complex oxide having a perovskite structure containing bismuth, barium, iron, manganese and titanium, and a second electrode. In addition, a layered compound portion containing iron, barium, titanium and oxygen is disposed between the piezoelectric layer and the first electrode.

By providing the layered compound portion made of a layered compound containing iron, barium, titanium and oxygen at the interface with the platinum first electrode of the piezoelectric layer made of a complex oxide having a perovskite structure containing bismuth, barium, iron, manganese and titanium, the adhesion between the piezoelectric layer and the first electrode can be enhanced in comparison with the case where the layered compound portion is not provided. Hence, the resulting piezoelectric element can ensure a high adhesion between the piezoelectric layer and the first electrode. Since the piezoelectric layer is thus prevented from separating from the first electrode, the liquid ejecting head can exhibit high durability and high reliability.

Preferably, the layered compound portion is disposed in an island shape. The influence of the layered compound portion on the distortion of the piezoelectric layer thus can be reduced.

The layered compound portion may contain manganese. By providing a layered compound portion made of oxides containing iron, barium, titanium and manganese between the piezoelectric layer and the first electrode, the adhesion between the piezoelectric layer and the first electrode can be enhanced in comparison with the case where the layered compound portion is not provided.

According to another aspect of the invention, a liquid ejecting apparatus including the above-described liquid ejecting head is provided. Since the piezoelectric layer and the first electrode have high adhesion with each other, the piezoelectric layer can be prevented from separating from the first electrode, and thus, the liquid ejecting apparatus can exhibit high durability and high reliability.

According to a still another aspect of the invention, a piezoelectric element is provided which includes a platinum first electrode, a piezoelectric layer made of a complex oxide having a perovskite structure containing bismuth, barium, iron, manganese and titanium, and a second electrode. In addition, a layered compound portion containing iron, barium, titanium and oxygen is disposed between the piezoelectric layer and the first electrode.

By providing the layered compound portion made of a layered compound containing iron, barium, titanium and oxygen at the interface with the platinum first electrode of the piezoelectric layer made of a complex oxide having a perovskite structure containing bismuth, barium, iron, manganese and titanium, the adhesion between the piezoelectric layer and the first electrode can be enhanced in comparison with the case where the layered compound portion is not provided. Hence, the resulting piezoelectric element can ensure a high adhesion between the piezoelectric layer and the first electrode.

BRIEF DESCRIPTION OF THE DRAWINGS

The invention will be described with reference to the accompanying drawings, wherein like numbers reference like elements.

FIGS. 14A to 14H are STEM-EDS map images of the piezoelectric element of Example 1.

FIGS. 15A and 15B are Cs-STEM images of the piezoelectric element of Example 1, showing a HAADF and a BF, respectively; and FIG. 15C is an intensity profile of the A and B sites of the perovskite structure.

FIGS. 16A to 16F are Cs-STEM images of the piezoelectric element of Example 1.

FIGS. 18A to 18G are STEM-EELS spectrum images of the layered compound portion of Example 1.

FIGS. 25A to 25H are STEM-EDS map images of the piezoelectric element of Example 2.

FIGS. 27A to 27H are EFTEM-BF images of a piezoelectric element of Example 4.

FIGS. 28A to 28H are EFTEM-BF images of a piezoelectric element of Example 5.

DESCRIPTION OF EXEMPLARY EMBODIMENTS

First Embodiment

Figure 1:
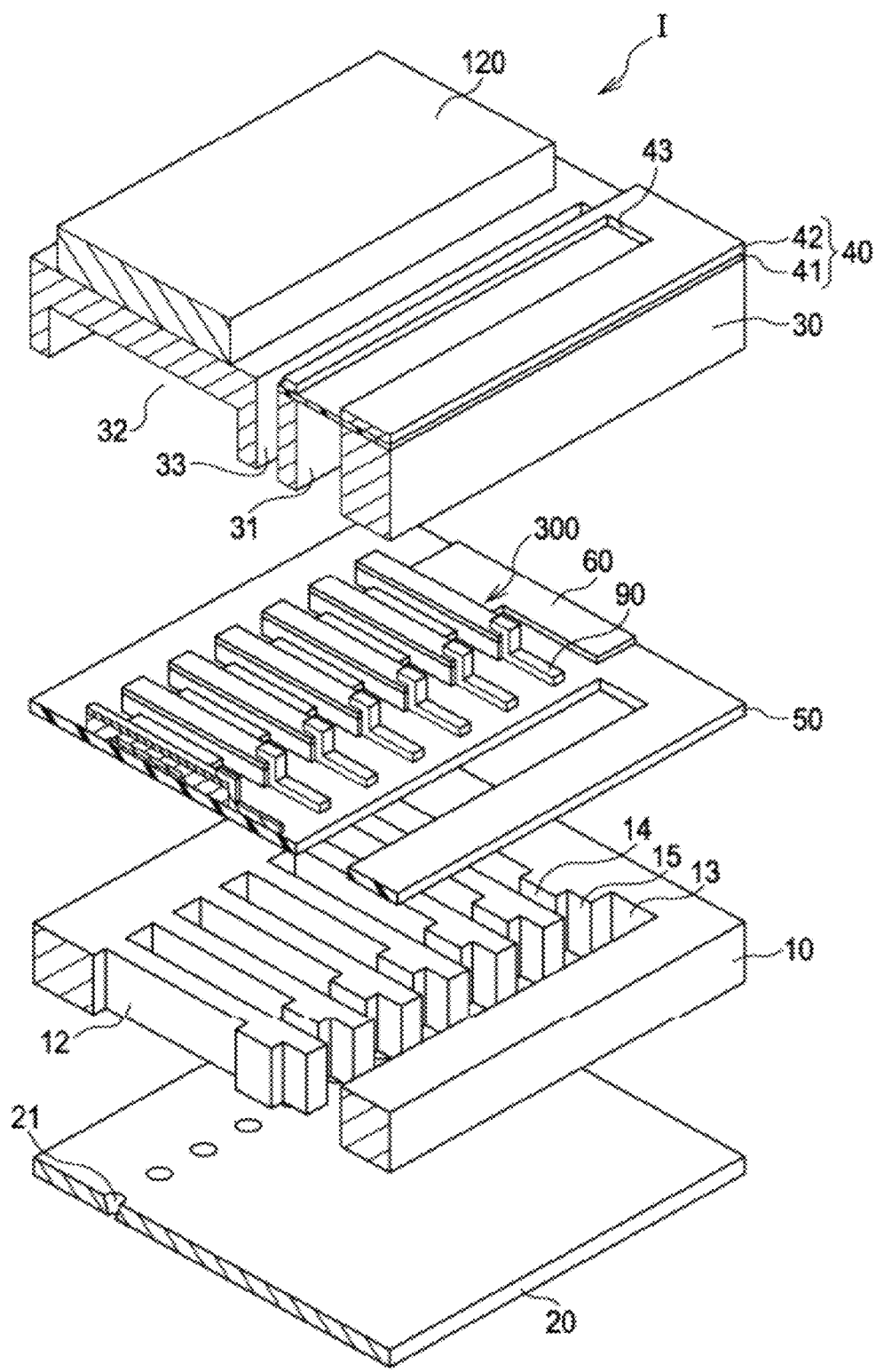
FIG. 1 is a schematic exploded perspective view of a recording head according to an embodiment of the invention.
Figure 2:
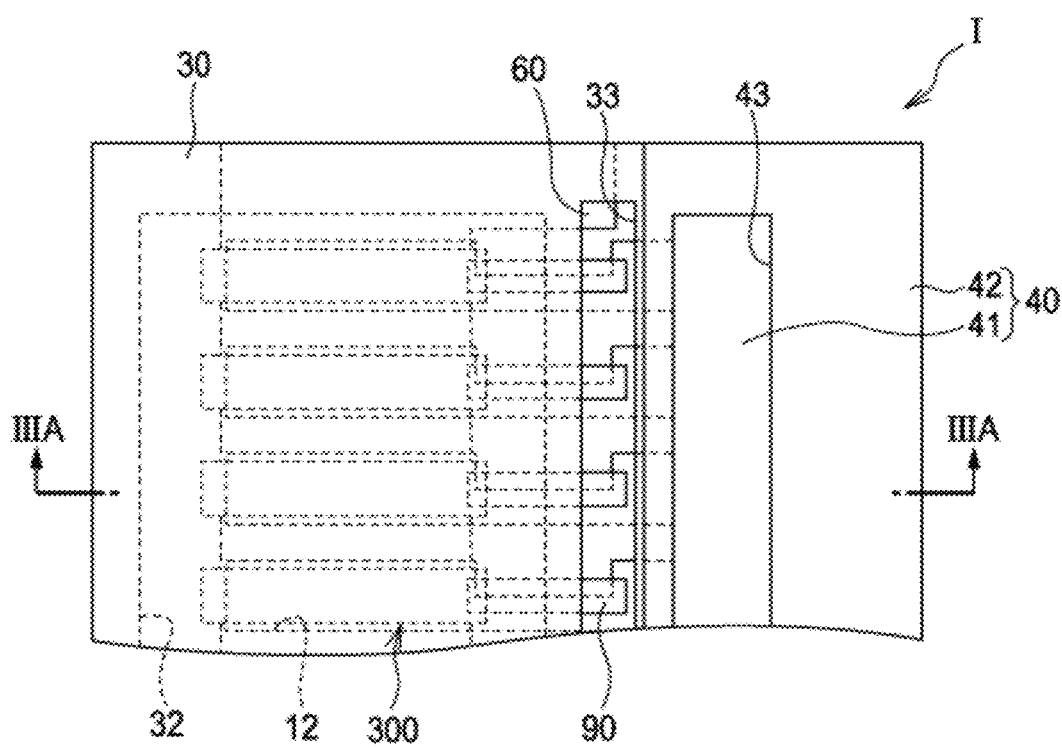
FIG. 2 is a plan view of the recording head according to the embodiment.
Figure 3A:
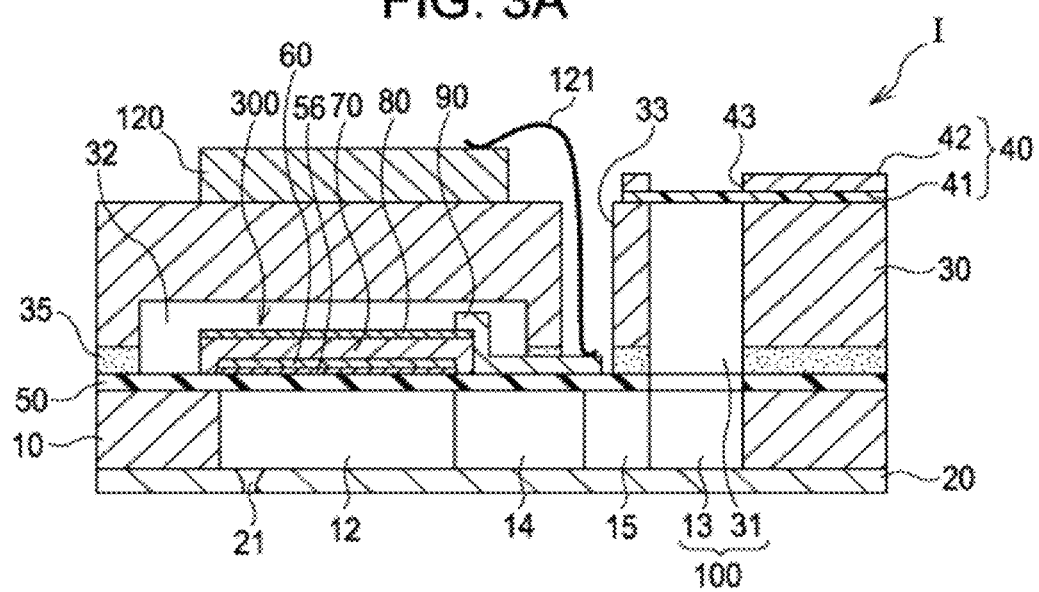
FIG. 3A is a sectional view of the recording head according to the embodiment.
Figure 3B:
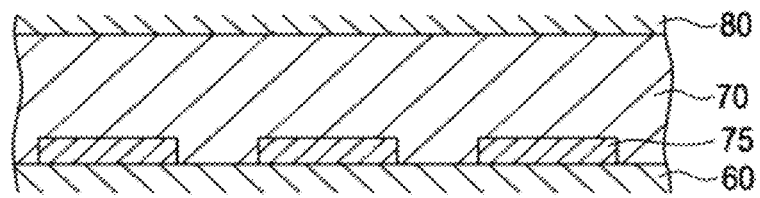
FIG. 3B is an enlarged sectional view of an essential portion of the recording head shown in FIG. 3A.
Figure 3C:
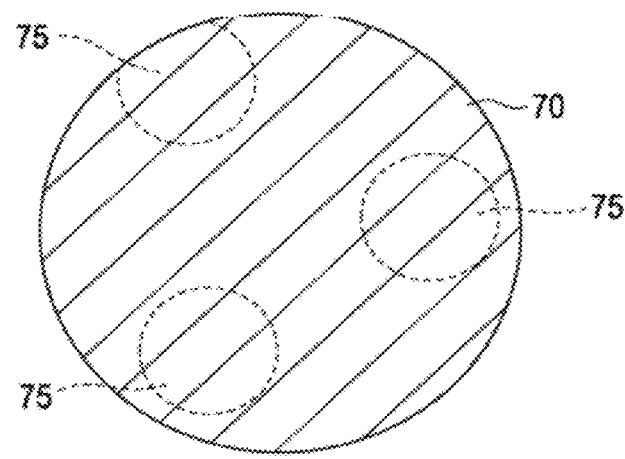
FIG. 3C is an enlarged plan view of the essential portion.

FIG. 1 is an exploded perspective view of an ink jet recording head, which is a type of liquid ejecting head, according to an embodiment of the invention. FIG. 2 is a plan view of the ink jet recording head shown in FIG. 1. FIG. 3A is the sectional view taken along line IIIA-IIIA in FIG. 2, FIG. 3B is an enlarged sectional view of an essential portion of the structure shown in FIG. 3A, and FIG. 3C is an enlarged plan view of the essential portion viewed from the side on which a second electrode is disposed. A flow channel substrate 10 is made of monocrystalline silicon, and a silicon dioxide elastic film 50 is disposed on one surface of the flow channel substrate 10, as shown in FIGS. 1 and 3A.

The flow channel substrate 10 has a plurality of pressure generating chambers 12 arranged in parallel in the direction of their widths. The flow channel substrate 10 also has a communicating section 13 therein to the outside of the pressure generating chambers 12 in their longitudinal direction. The communicating section 13 communicates with the pressure generating chambers 12 through corresponding ink supply channels 14 and communication paths 15. The communicating section 13 communicates with a reservoir section 31 formed in a protective substrate (described later) to define part of a reservoir acting as a common ink chamber of the pressure generating chambers 12. Each ink supply channel 14 has a smaller width than the pressure generating chamber 12, so that the flow channel resistance of the ink delivered to the pressure generating chamber 12 from the communicating section 13 is kept constant. Although the ink supply channels 14 are formed by narrowing the flow channels from one side in the present embodiment, the flow channels may be narrowed from both sides in another embodiment. Alternatively, the ink supply channels 14 may be formed by reducing the depth of the flow channels, instead of narrowing the flow channels. In the present embodiment, the flow channel substrate 10 has liquid flow channels including the pressure generating chambers 12, the communicating section 13, the ink supply channels 14 and the communication paths 15.

The flow channel substrate 10 is joined with a nozzle plate 20 at the open side thereof with an adhesive, a thermal fusion film or the like. The nozzle plate 20 has nozzle apertures 21 communicating with the end portions of the corresponding pressure generating chambers 12 opposite to the ink supply channels 14. The nozzle plate 20 can be made of, for example, glass-ceramic, monocrystalline silicon or stainless steel.

On the opposite side to the open side of the flow channel substrate 10, the above-mentioned elastic film 50 is disposed, and an adhesion layer 56 having a thickness of, for example, about 30 to 50 nm and made of titanium oxide or the like is disposed on the elastic film 50 to enhance the adhesion between the elastic film 50 and the overlying first electrode 60. The elastic film 50 may be provided thereon with an insulating film made of zirconium oxide or the like, if necessary.

Furthermore, piezoelectric elements 300 are disposed on the adhesion layer 56. Each piezoelectric element 300 has a multilayer structure including the first electrode 60 made of platinum, a piezoelectric layer 70 having a small thickness of 2 μm or less, preferably 0.3 to 1.5 μm, and a second electrode 80. The piezoelectric element 300 mentioned herein refers to the portion including the first electrode 60, the piezoelectric layer 70 and the second electrode 80. In general, either electrode of the piezoelectric element 300 acts as a common electrode, and the other electrode and the piezoelectric layer 70 are formed for each pressure generating chamber 12 by patterning. Although in the present embodiment, the first electrode 60 acts as the common electrode of the piezoelectric elements 300 and the second electrode 80 is provided as discrete electrodes of the piezoelectric elements 300, the functions of the first and second electrodes may be reversed for the sake of convenience of the driving circuit and wiring. An actuator device mentioned herein is defined by a combination of the piezoelectric element 300 and a vibration plate that can be displaced by the operation of the piezoelectric element 300. Although in the embodiment above, the elastic film 50, the adhesion layer 56, the first electrode 60, and optionally the optionally provided insulating film act as a vibration plate, the structure of the vibration plate is not limited to the above, and the elastic film 50 or the adhesion layer 56 are not necessarily formed. The piezoelectric element 300 may double as a vibration plate in substance.

The piezoelectric material forming the piezoelectric layer 70 is a complex oxide having a perovskite structure containing bismuth (Bi), barium (Ba), iron (Fe), manganese (Mn) and titanium (Ti). The A site of the perovskite structure expressed by $ABO_3$ has 12 oxygen ligands, and the B site has 6 oxygen ligands to form an octahedron. Bi and Ba are present in the A site, and Fe, Mn and Ti are present in the B site. In other words, the complex oxide having a perovskite structure containing bismuth, barium, iron, manganese and titanium is a solid solution in which bismuth ferrate manganate and barium titanate are homogeneously dissolved in a solid state.

Preferably, the complex oxide having a perovskite structure containing bismuth, barium, iron, manganese and titanium has a composition expressed by the following general formula (1). However, since general formula (1) represents a composition according to the stoichiometry, unavoidable deviation from the stoichiometric composition, resulting from elemental diffusion, lattice mismatch, deficient oxygen or the like is acceptable.

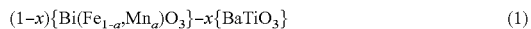

$$(1-x)\{Bi(Fe_{1-a}Mn_a)O_3\}-x\{BaTiO_3\} \quad (1)$$

where $0.1 \leq x \leq 0.4$, and $0.01 \leq a \leq 0.1$.

In the present embodiment, layered compound portions 75 made of a layered compound are provided at the interface of the piezoelectric layer 70 with the first electrode 60, as shown in FIG. 3B. In other words, the layered compound portions 75 are disposed between the piezoelectric layer 70 and the first electrode 60. The layered compound portions 75 are made of a layered compound containing iron, barium, titanium and oxygen, that is, a layered oxide containing iron, barium and titanium. Layered compounds have a structure including planar crystal layers. The layered compound of the layered compound portions 75 may further contain manganese.

Preferably, the layered compound of the layered compound portions 75 is preferentially oriented along the (001) plane. A (001)-oriented layered compound can be formed to a small thickness so as to reduce the loss of the voltage applied to the piezoelectric layer 70. The phrase "crystals are preferentially oriented along the (001) plane" used herein may mean that all the crystals are oriented along the (001) plane, or mean that almost all the crystals (for example, 90% or more) are oriented along the (001) plane. The same applies to the cases of, for example, preferentially orienting in the (111) plane, in the (110) plane or in the (100) plane in other embodiments of the invention.

By providing the layered compound portions 75 made of a layered compound containing iron, barium, titanium and oxygen at the interface with the platinum first electrode 60 of the piezoelectric layer 70 made of a complex oxide having a perovskite structure containing bismuth, barium, iron, manganese and titanium, the adhesion between the piezoelectric layer 70 and the first electrode 60 can be enhanced. Consequently, the resulting piezoelectric element 300 can ensure a high adhesion between the piezoelectric layer 70 and the first electrode 60.

Both the piezoelectric material of the piezoelectric layer 70 and the layered compound of the layered compound portion 75 are oxides and contain the same metals. Accordingly, their thermal expansion coefficients are close to each other. Also, their crystal lattices have similar lengths in a axis and b axis, so that mismatch between lattices can be small and, thus, stress can be reduced. Consequently, the adhesion between the piezoelectric layer 70 and the layered compound portions 75 can be high. Furthermore, as will be described in Examples, the layered compound containing iron, barium, titanium and oxygen forms a monocrystalline layer on the platinum layer of the first electrode 60 so as to continue from the lattices of the platinum layer. Thus, the platinum of the first electrode 60 and the layered compound of the layered compound portion 75 containing iron, barium, titanium and oxygen have a high adhesion therebetween. Therefore, the adhesion between the piezoelectric layer 70 and the first electrode 60 can be enhanced relative to the case where the layered compound portions 75 are not provided.

The shape of the layered compound portion 75 is not particularly limited, and may be circular, as shown in FIG. 3C, or oval, when viewed from the second electrode 80 side. Preferably, the layered compound portions are formed in an island shape. An island shape refers to a state where layered compound portions 75 are disposed at intervals at the interface between the piezoelectric layer 70 and the first electrode 60 so as not to cover the entire surface of the interface. It is preferable that a plurality of layered compound portions 75 be disposed at intervals. By providing the layered compound portions 75 in an island shape, a rough interface is formed between the layered compound portions 75 and the piezoelectric layer 70, so that the adhesion between the layered compound portions 75 and the piezoelectric layer 70 is enhanced. Although the presence of the layered compound portion 75 reduces the voltage applied to the piezoelectric layer 70 and thus reduces the distortion of the piezoelectric layer 70, the island shape arrangement of layered compound portions 75 can reduce the loss of the voltage applied to the piezoelectric layer 70, and, thus, the effect of the layered compound portion 75 on the distortion can be reduced.

The second electrode 80 provided for each piezoelectric element 300 is connected with a lead electrode 90 made of, for example, gold (Au) extending from one end at the ink supply channel 14 side of the second electrode 80 to the upper surface of the elastic film 50 and, optionally, the upper surface of an insulating film.

A protective substrate 30 having a reservoir section 31 defining at least part of a reservoir 100 is joined to the flow channel substrate 10 having the piezoelectric elements 300 with an adhesive 35 so as to cover the first electrode 60, the elastic film 50, an optionally provided insulating film, and the lead electrodes 90. The reservoir section 31 passes through the thickness of the protective substrate 30 and extends along the widths of the pressure generating chambers 12. Thus, the reservoir section 31 communicates with the communicating section 13 of the flow channel substrate 10 to form the reservoir 100 acting as the common ink chamber of the pressure generating chambers 12. The communicating section 13 of the flow channel substrate 10 may be divided for each pressure generating chamber 12, and only the reservoir section 31 may serve as the reservoir. Alternatively, the flow channel substrate 10 may have only the pressure generating chambers 12, and the reservoir 100 and ink supply channels 14 communicating with the respective pressure generating chambers 12 are formed in a member between the flow channel substrate 10 and the protective substrate 30, such as the elastic film 50 and an optionally provided insulating film.

A piezoelectric element-protecting section 32 is formed in the region of the protective substrate 30 corresponding to the piezoelectric elements 300. The Piezoelectric element-protecting section 32 has a space so that the piezoelectric elements 300 can operate without interference. The space of the piezoelectric element-protecting section 32 is intended to ensure the operation of the piezoelectric elements 300, and may or may not be sealed.

Preferably, the protective substrate 30 is made of a material having substantially the same thermal expansion coefficient as the flow channel substrate 10, such as glass or ceramic. In the present embodiment, the protective substrate 30 is made of the same monocrystalline silicon as the flow channel substrate 10.

The protective substrate 30 has a through hole 33 passing through the thickness of the protective substrate 30. The respective lead electrodes 90 extending from the piezoelectric elements 300 are exposed in the through hole 33.

A driving circuit 120 is secured on the protective substrate 30 to drive the piezoelectric elements 300 arranged in parallel. The driving circuit 120 may be a circuit board, a semiconductor integrated circuit (IC) or the like. The driving circuit 120 is electrically connected to each lead electrode 90 with a conductive connection wire 121, such as bonding wire.

Furthermore, a compliance substrate 40 including a sealing film 41 and a fixing plate 42 is joined on the protective substrate 30. The sealing film 41 is made of a flexible material having a low rigidity, and seals one end of the reservoir section 31. The fixing plate 42 is made of a relatively hard material. The portion of the fixing plate 42 opposing the reservoir 100 is completely removed to form an opening 43; hence the reservoir 100 is closed at one end only with the flexible sealing film 41.

The ink jet recording head I of the present embodiment draws an ink through an ink inlet connected to an external ink supply means (not shown). The ink is delivered to fill the spaces from the reservoir 100 to the nozzle apertures 21. Then, the ink jet recording head I applies a voltage between the first electrode 60 and each second electrode 80 corresponding to the pressure generating chambers 12, according to the recording signal from the driving circuit 120. Thus, the elastic film 50, the adhesion layer 56, the first electrode 60 and the piezoelectric layers 70 are deformed to increase the internal pressure in the pressure generating chambers 12, thereby ejecting the ink through the nozzle apertures 21. Since the present embodiment ensures high adhesion between the first electrode 60 and the piezoelectric layer 70, the first electrode 60 is prevented from separating from the piezoelectric layer 70 even if the piezoelectric element is repeatedly operated. Thus, the ink jet recording head or liquid ejecting head can exhibit high durability and reliability.

A method for manufacturing the ink jet recording head according to the present embodiment will be described with reference to FIGS. 4A to 8B. FIGS. 4A to 8B are sectional views of the pressure generating chamber taken in the longitudinal direction.

Figure 4A:
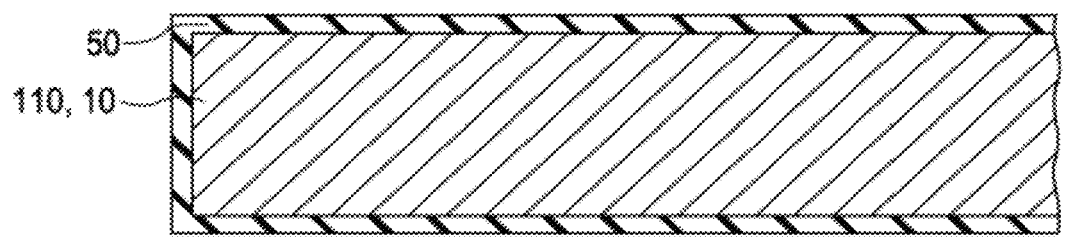
FIGS. 4A and 4B are sectional views showing a manufacturing process of the recording head according to the embodiment.
Figure 4B:
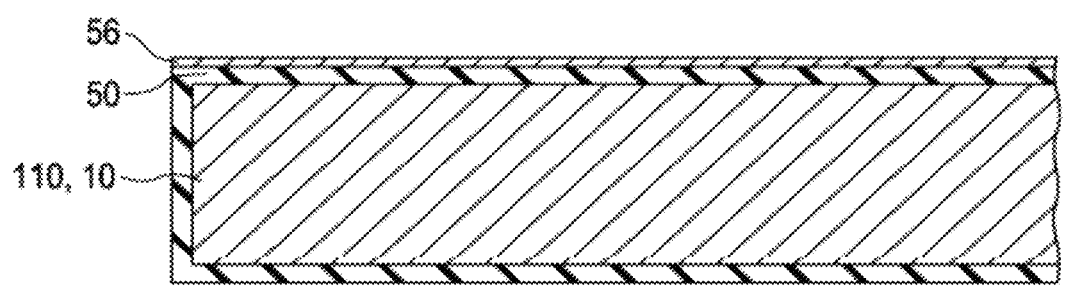

As shown in FIG. 4A, a silicon dioxide ($SiO_2$) film is formed for an elastic film 50 on the surface of a silicon wafer 110 for a flow channel substrate by thermal oxidation or the like. Then, an adhesion layer 56 is formed of, for example, titanium oxide on the $SiO_2$ elastic film 50 by sputtering, thermal oxidation or the like, as shown in FIG. 4B.

Figure 5A:
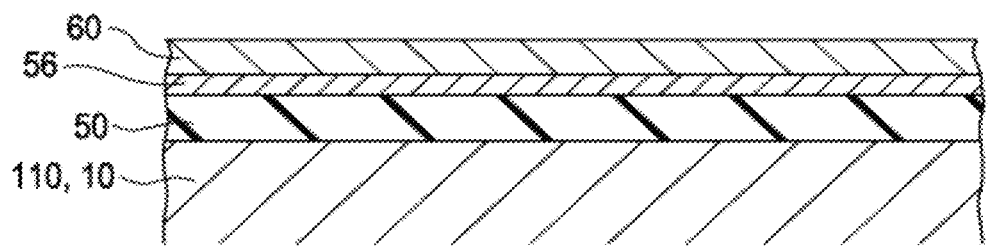
FIGS. 5A to 5C are sectional views showing the manufacturing process of the recording head according to the embodiment.

Subsequently, as shown in FIG. 5A, a platinum first electrode 60 is formed over the entire surface of the adhesion layer 56 by sputtering.

Then, layered compound portions 75 and piezoelectric layers 70 are formed in that order on the first electrode 60. The piezoelectric layer 70 may be formed by any method without particular limitation. For example, a chemical solution method may be applied, such as a sol-gel method or a metal-organic decomposition (MOD) method in which a solution of organic metal compounds containing Bi, Fe, Mn, Ti and Ba dissolved or dispersed in a solvent is applied onto the first electrode 60, and the coating of the solution is dried and then fired to form a metal oxide piezoelectric layer 70. Other methods may be used, such as laser ablation, sputtering, pulsed laser deposition (PLD), CVD or aerosol deposition, irrespective of liquid process or solid process.

Also, the layered compound portion 75 can be formed by any method without particular limitation. For example, a chemical solution method may be used, such as a sol-gel method or MOD in which a solution of organic metal compounds containing Fe, Ti and Ba, and optionally Mn, dissolved or dispersed in a solvent is applied onto the first electrode 60, and the coating of the solution is dried and then fired to form the layered compound portion 75.

Figure 5B:
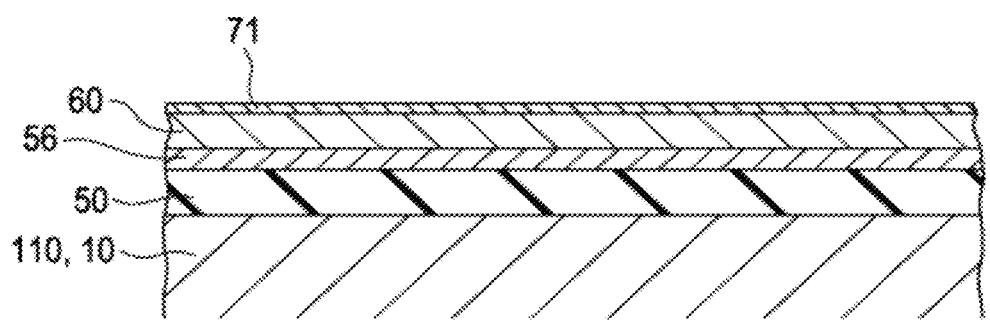

The layered compound portion 75 and the piezoelectric layer 70 may be formed by a series of operations performing a chemical solution method, such as MOD or a sol-gel method. More specifically, the layered compound portion 75 and the piezoelectric layer 70 are formed by a series of operations as below. First, as shown in FIG. 5B, a sol or MOD solution (precursor solution) containing organic metal compounds containing Bi, Fe, Mn, Ti and Ba in a desired proportion is applied onto the first electrode 60 by spin coating or the like to form a piezoelectric precursor film 71 (coating).

The precursor solution is prepared by mixing organic metal compounds containing Bi, Fe, Mn, Ti and Ba so that the metals have desired mole fractions, and dissolving or dispersing the mixture in an organic solvent such as an alcohol. In the present embodiment, the molar ratios of the metals in the precursor solution satisfy the following relationships $0.01 \leq Ba/Bi \leq 0.6$ and $0.01 \leq Mn/Bi \leq 0.1$. Organic metal compounds containing Bi, Fe, Mn, Ti or Ba include metal alkoxides, organic acid salts, and β-diketone complexes. For example, the organic metal compound containing Bi may be bismuth 2-ethylhexanoate. For example, the organic metal compound containing Fe may be iron 2-ethylhexanoate. For example, the organic metal compound containing Mn may be manganese 2-ethylhexanoate. Examples of the organic metal compound containing Ti include titanium isopropoxide, titanium 2-ethylhexanoate, and titanium diisopropoxide bis (acetylacetonate). Examples of the organic metal compound containing Ba include barium isopropoxide, barium 2-ethylhexanoate, and barium acetylacetonate. Organic metal compounds containing two or more of Bi, Fe, Mn, Ti and Ba may of course be used.

Subsequently, the piezoelectric precursor film 71 is dried for a certain time by heating to a predetermined temperature (for example, 150 to 200° C.) (drying). Then, the dried piezoelectric precursor film 71 is degreased by being heated to a predetermined temperature (for example, 350 to 450° C.) and allowed to stand at that temperature for a certain time (degreasing). The degreasing mentioned herein is performed to convert organic components in the piezoelectric precursor film 71 into, for example, $NO_2$, $CO_2$ or $H_2O$ and thus to remove the organic components. The drying and degreasing may be performed in any atmosphere without particular limitation, and may be performed in the air, an oxygen atmosphere or an inert gas atmosphere. The operations for coating, drying and degreasing may be repeated.

Figure 5C:
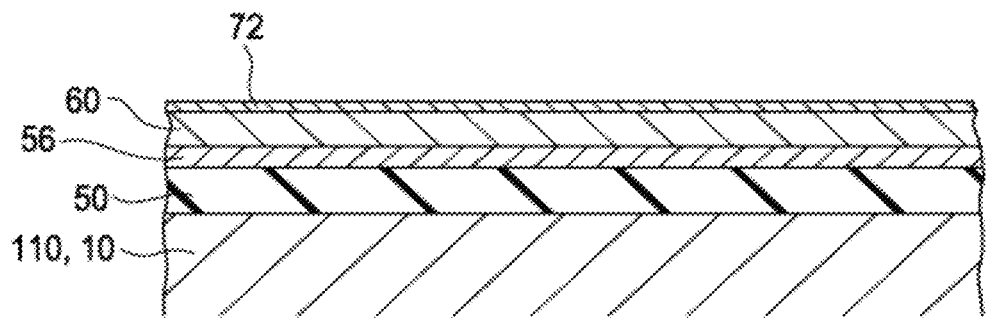

Then, the piezoelectric precursor film 71 is crystallized by being heated and allowed to stand for a certain time, thus forming a piezoelectric film 72, as shown in FIG. 5C (firing). This heating can be performed at a temperature of, for example, about 600 to 800° C. The shape of the layered compound portion 75 can be controlled by heat quantity in the firing operation. By controlling the firing temperature, the firing time, and the number of times of firing, the layered compound portion 75 can be formed in a desired shape. The firing operation may be performed in any atmosphere without particular limitation, and may be performed in the air, an oxygen atmosphere or an inert gas atmosphere.

The heating apparatus used for the drying, degreasing and firing operations can be performed may be a rapid thermal annealing (RTA) apparatus using an infrared lamp for heating, or a hot plate.

Figure 6A:
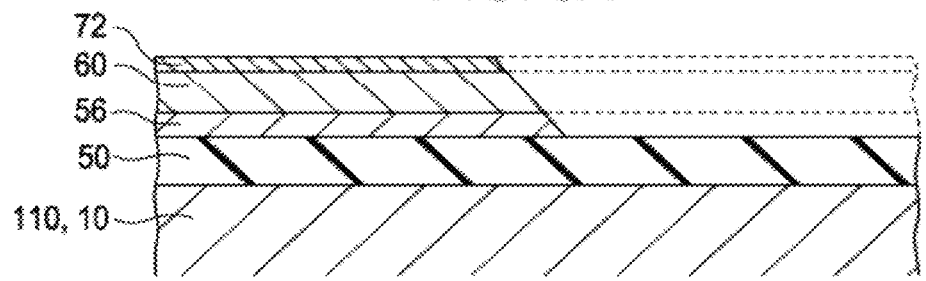
FIGS. 6A to 6C are sectional views showing the manufacturing process of the recording head according to the embodiment.

Then, a resist layer having a predetermined shape (not shown) is formed on the piezoelectric film 72, and the piezoelectric film 72 and the first electrode 60 are simultaneously patterned in such a manner that their sides are inclined, as shown in FIG. 6A, using the resist layer as a mask.

Figure 6B:
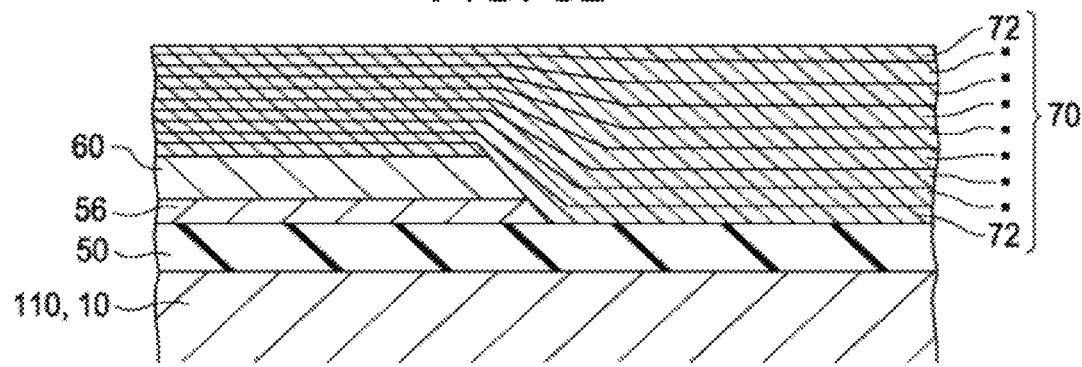
Figure 6C:
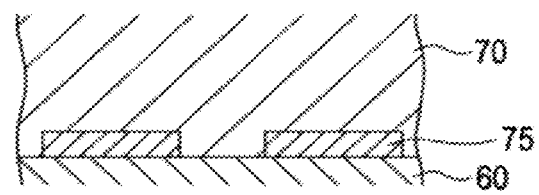

The operations of coating, drying and degreasing, or the operations of coating, drying, degreasing and firing may be repeated according to the desired thickness, so that the piezoelectric layer 70 including a plurality of piezoelectric films 72 is formed. Thus, the piezoelectric layer 70 has a predetermined thickness, including a plurality of piezoelectric films 72, as shown in FIG. 6B, with the layered compound portions 75 disposed at the interface of the piezoelectric layer 70 with the first electrode 60, as shown in the enlarged view of FIG. 6C. If, for example, a coating formed by a single operation of applying a coating solution has a thickness of about 0.1 μm, the piezoelectric layer 70 including 10 piezoelectric films 72 has a total thickness of about 1.0 μm. For forming a plurality of piezoelectric films 72, the operations of coating, drying, degreasing and firing may be performed step by step, or the firing operation may be performed at one time after the sequence of operations of coating, drying and degreasing has been repeated.

Figure 7A:
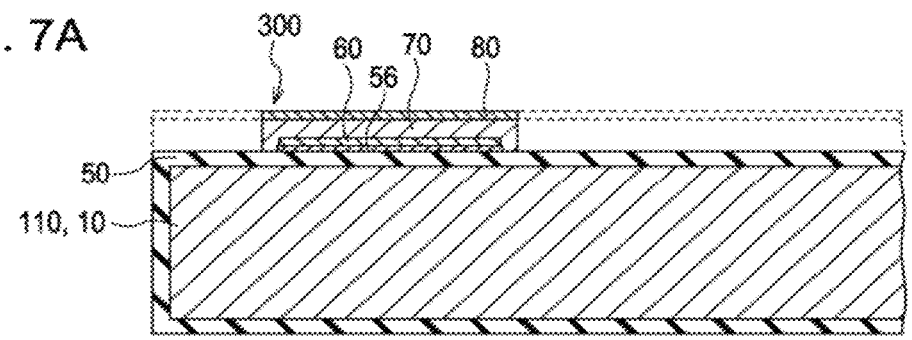
FIGS. 7A to 7C are sectional views showing the manufacturing process of the recording head according to the embodiment.

After the piezoelectric layer 70 is formed, a second electrode 80 is formed of platinum on the piezoelectric layer 70 by sputtering or the like, and the piezoelectric layer 70 and the second electrode 80 are simultaneously patterned to form piezoelectric elements 300, as shown in FIG. 7A. Each piezoelectric element 300 includes the first electrode 60, the piezoelectric layer 70 and the second electrode 80, in the regions corresponding to the pressure generating chambers 12. The patterning of the piezoelectric layer 70 and the second electrode 80 can be performed at one time by dry etching through a resist layer (not shown) having a predetermined shape. Then, post-annealing may be performed at a temperature in the range of, for example, 600 to 800° C., if necessary. Thus, favorable interfaces can be formed between the piezoelectric layer 70 and the first electrode 60 and between the piezoelectric layer 70 and the second electrode 80, and, in addition, the crystallinity of the piezoelectric layer 70 can be enhanced.

Figure 7B:
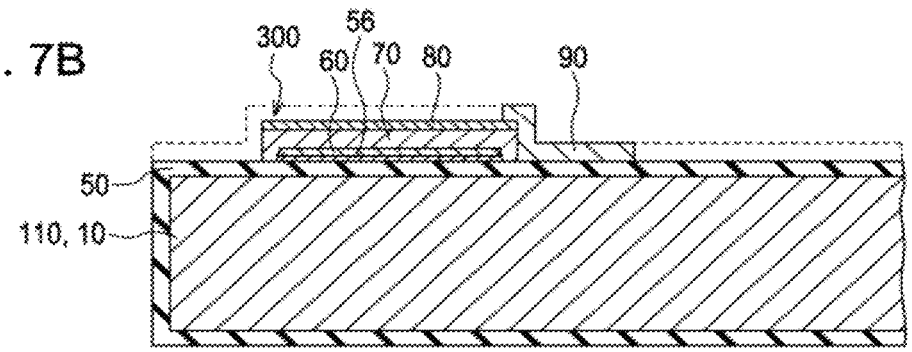

Then, a film is formed of, for example, gold (Au), over the entire surface of the flow channel substrate wafer 110, and is patterned into lead electrodes 90 for each piezoelectric element 300, as shown in FIG. 7B, through a mask pattern (not shown) made of, for example, resist.

Figure 7C:
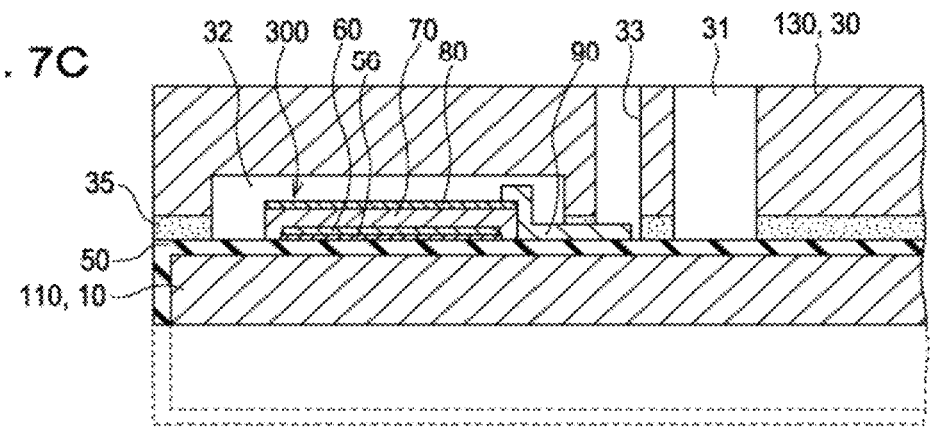

Then, a silicon protective substrate wafer 130 for a plurality of protective substrates 30 is bonded to the piezoelectric element 300 side of the flow channel substrate wafer 110 with an adhesive 35, and the thickness of the flow channel substrate wafer 110 is reduced to a predetermined level, as shown in FIG. 7C.

Figure 8A:
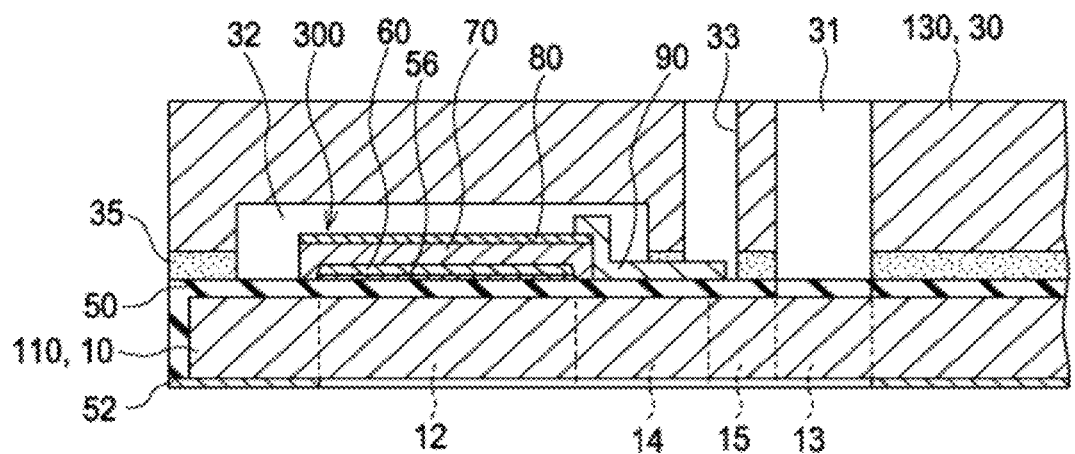
FIGS. 8A and 8B are sectional views showing the manufacturing process of the recording head according to the embodiment.

Turning to FIG. 8A, a mask layer is formed on the surface of the flow channel substrate wafer 110 opposite to the protective substrate wafer 130 and is patterned into a mask 52 having a predetermined shape.

Figure 8B:
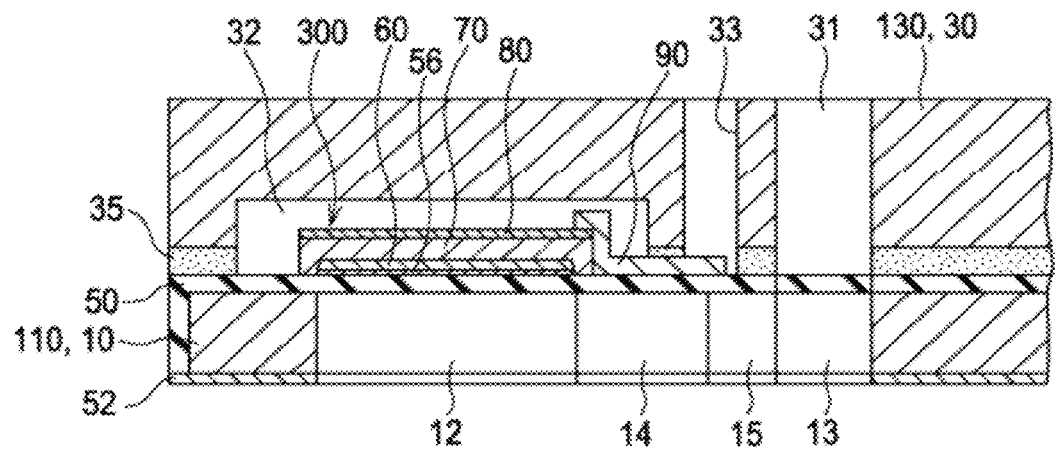

Subsequently, as shown in FIG. 8B, the flow channel substrate wafer 110 is subjected to anisotropic etching (wet etching) using an alkaline solution, such as KOH, through the mask 52 to form the pressure generating chambers 12 corresponding to the piezoelectric elements 300, the communicating section 13, the ink supply channels 14 and the communication paths 15 therein.

Then, unnecessary outer portions of the flow channel substrate wafer 110 and protective substrate wafer 130 are cut off by, for example, dicing. Subsequently, a nozzle plate 20 having nozzle apertures 21 therein is joined to the surface of the flow channel substrate wafer 110 opposite the protective substrate wafer 130 after the mask 52 have been removed, and a compliance substrate 40 is joined to the protective substrate wafer 130. The flow channel substrate wafer 110 joined with other substrates together is cut into chips, each including a flow channel substrate 10 and other members. Thus, the ink jet recording head I of the present embodiment is produced.

EXAMPLES

The invention will be further described in detail with reference to Examples below. However, the invention is not limited to the following Examples.

Example 1

First, a silicon dioxide film was formed to a thickness of 1200 nm on a (100)-oriented monocrystalline silicon substrate by thermal oxidation. Subsequently, a titanium film was formed to a thickness of 40 nm on the silicon dioxide film by RF magnetron sputtering, and was then oxidized to form a titanium oxide film. Then, a platinum film was formed to a thickness of 100 nm on the titanium oxide film by RF magnetron sputtering, thus forming a (111)-oriented first electrode 60.

A precursor solution was prepared by mixing bismuth 2-ethylhexanoate, iron acetylacetonate, barium acetate, titanium isopropoxide and manganese acetylacetonate in a predetermined proportion in n-butanol.

The precursor solution was dropped onto the surface of the substrate on which the titanium oxide film and the first electrode 60 had been formed, and was then subjected to spin coating at a speed of 3000 rpm, thus forming a piezoelectric precursor film (coating). Then, the piezoelectric precursor film on the substrate was dried on a hot plate at 180° C. for 2 minutes (drying). The piezoelectric precursor film was further subjected to degreasing on a hot plate at 450° C. for 2 minutes (degreasing). The sequence of the operations of coating, drying and degreasing was performed twice, and, then, the resulting precursor film was fired at 800° C. for 5 minutes in an oxygen atmosphere using a rapid thermal annealing (RTA) apparatus (firing).

Subsequently, a sequence performing two sequences of the operations of coating, drying and degreasing and then performing the firing operation was performed four times. Thus, a piezoelectric layer 70 was formed to a thickness of 841 nm by 10 coating operations in total.

Then, a platinum film having a diameter of 500 μm and a thickness of 100 nm was formed as a second electrode 80 on the piezoelectric layer 70 by DC sputtering, and was then fired at 750° C. for 5 minutes by RTA to complete a piezoelectric element including a piezoelectric layer made of a complex oxide having the perovskite structure expressed by general formula (1) where x=0.25 and a=0.05.

Examination 1

Figure 9:
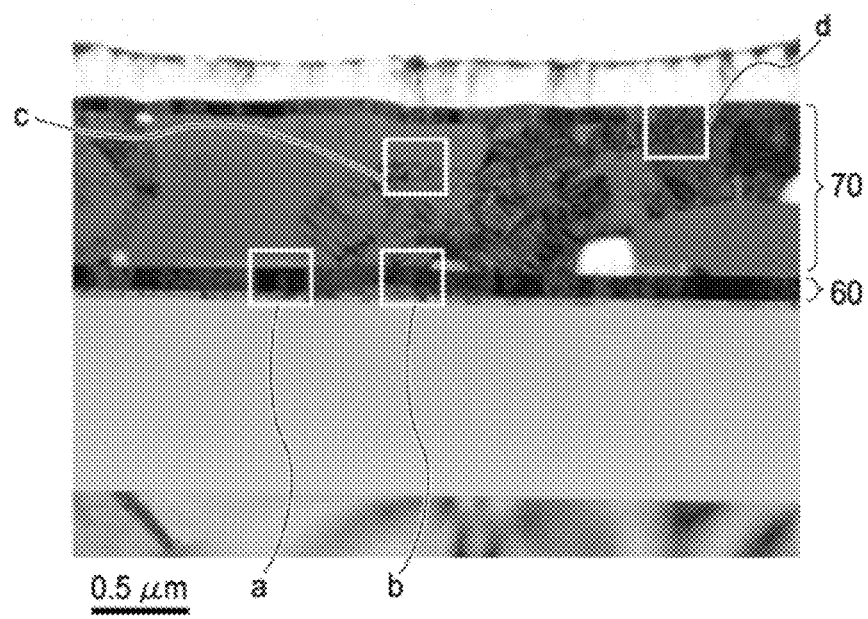
FIG. 9 is an EFTEM-BF image of a piezoelectric element of Example 1.
Figure 10:
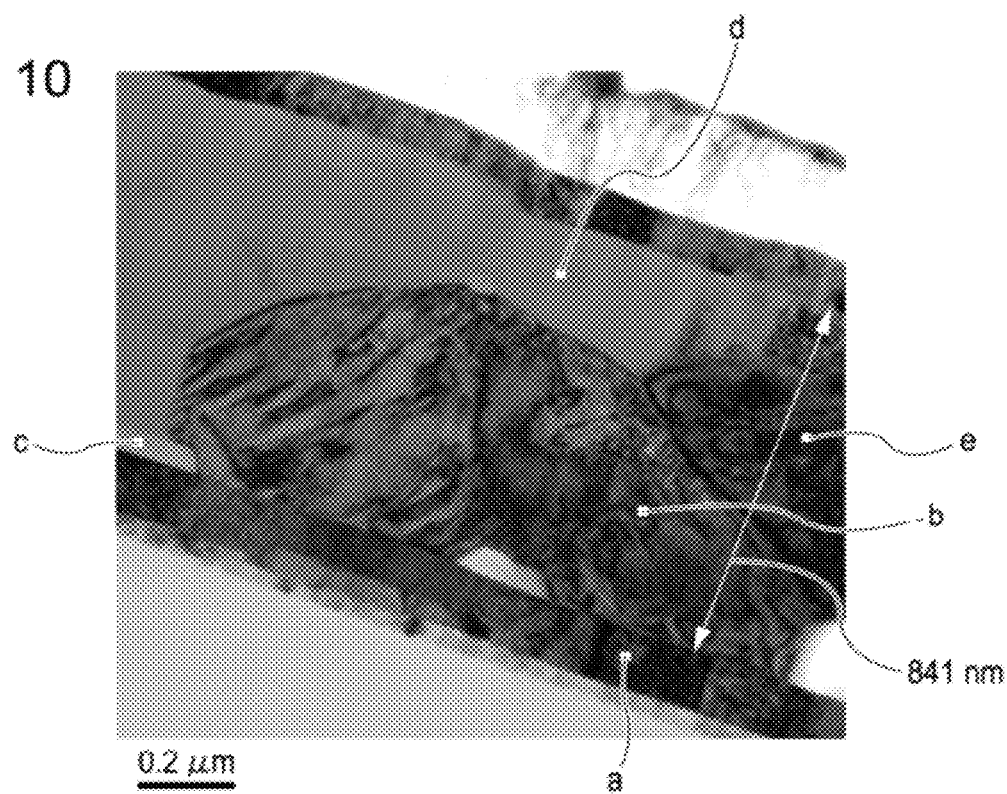
FIG. 10 is an enlargement of the EFTEM-BF image of the piezoelectric element of Example 1.

The section along the thickness direction of the piezoelectric element of Example 1 was observed through an EFTEM (energy-filtering transmission electron microscope). The EFTEM-BF (Bright Field) image obtained is shown in FIG. 9. Also, FIG. 10 shows an enlargement of a part of FIG. 9. FIGS. 11A to 11E are electron diffraction images at points a to e indicated by the square dots shown in FIG. 10, respectively. The enlargements of portions a to d surrounded by the square lines in FIG. 9 are shown in FIGS. 12A (portion a) and 12B (portion b) and FIGS. 13A (portion c) and 13B (portion d), respectively.

Figure 11A:
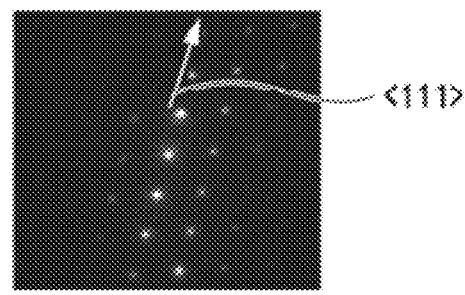
FIGS. 11A to 11E are electron diffraction images of the piezoelectric element of Example 1.
Figure 11B:
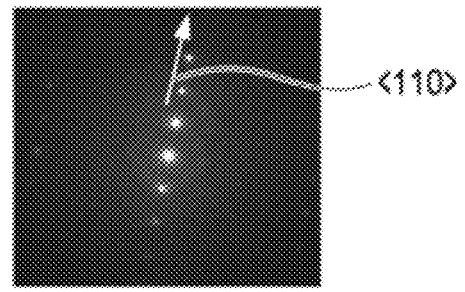
Figure 11C:
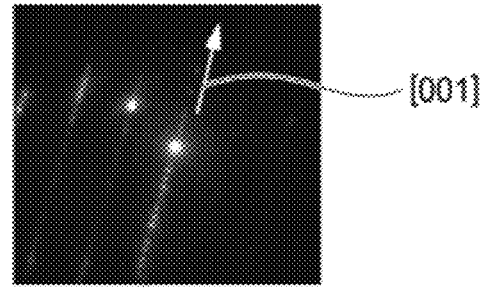
Figure 11D:
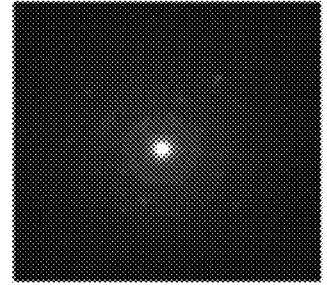
Figure 11E:
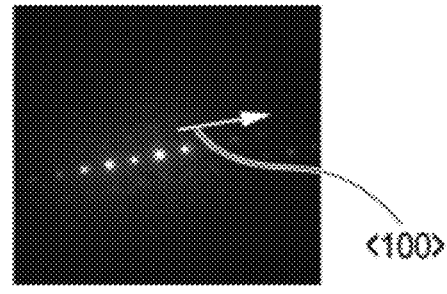
Figure 12A:
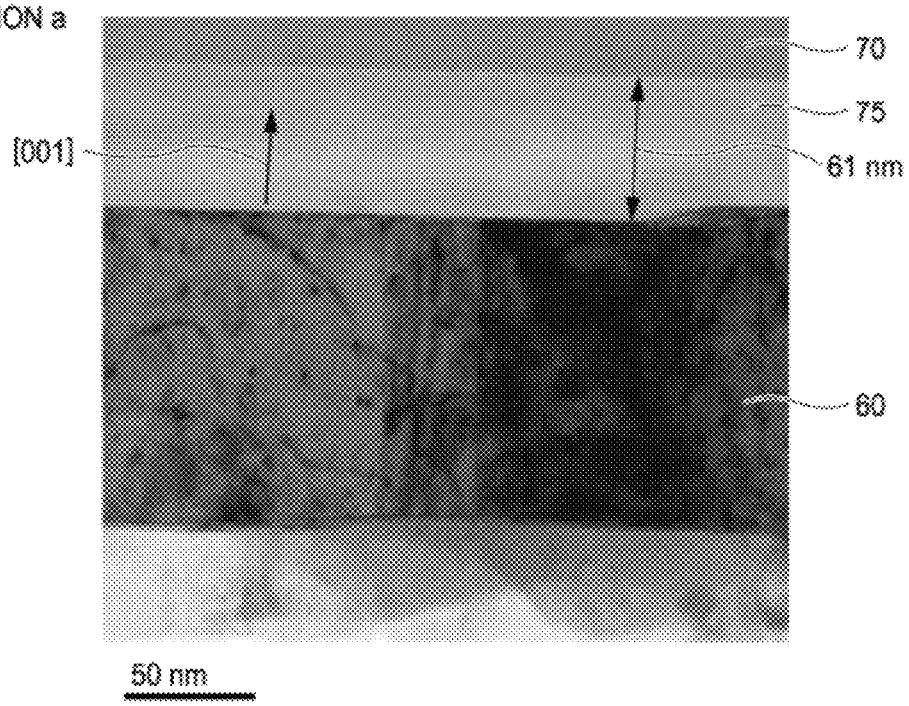
FIGS. 12A and 12B are enlarged EFTEM-BF images of the piezoelectric element of Example 1.
Figure 12B:
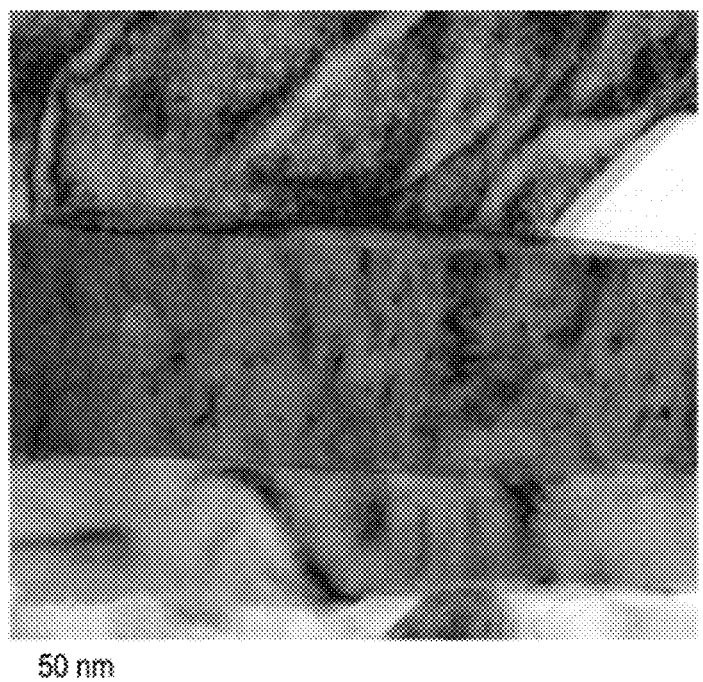
Figure 13A:
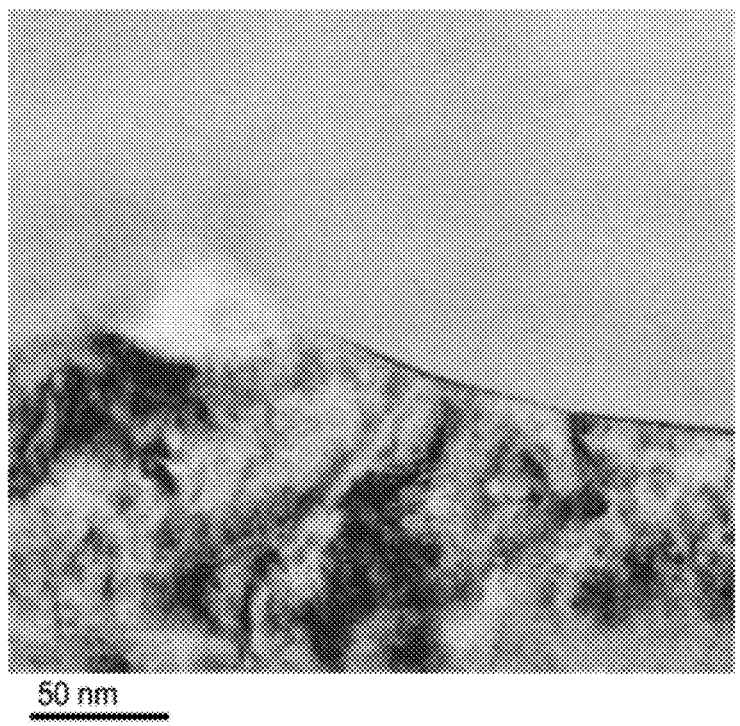
FIGS. 13A and 13B are enlarged EFTEM-BF images of the piezoelectric element of Example 1.
Figure 13B:
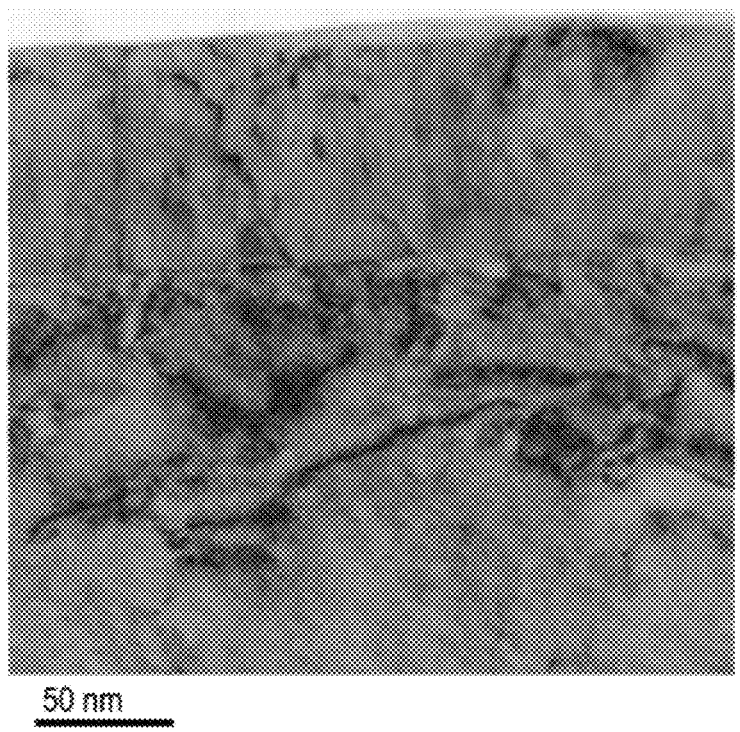
Figure 14H:
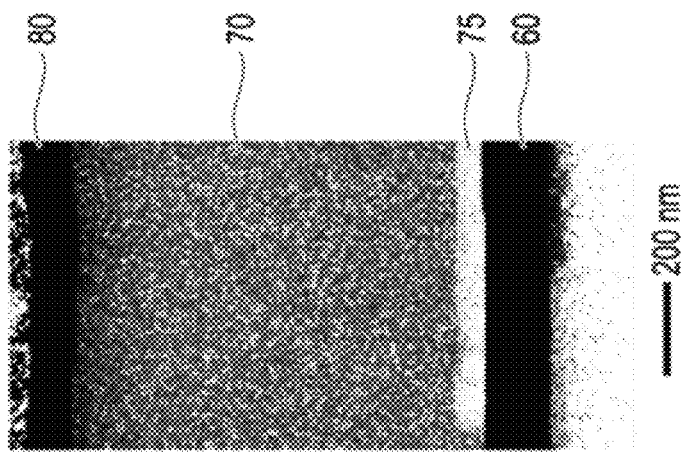
Figure 14G:
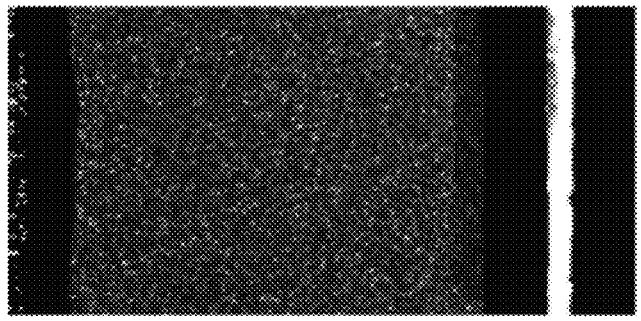
Figure 14F:
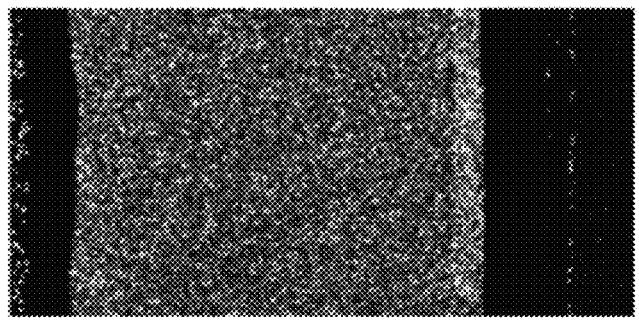
Figure 14E:
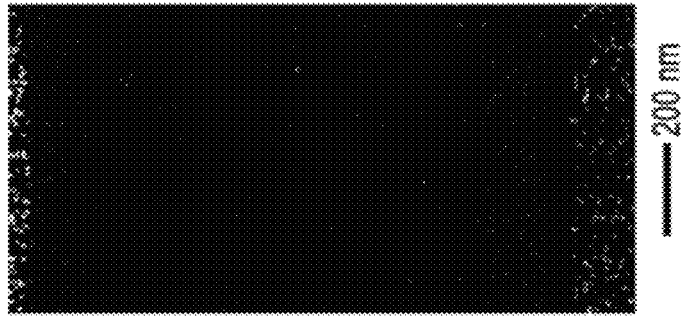

As shown in FIG. 12A, a pattern of a layer was observed between the piezoelectric layer 70 and the first electrode 60, and it was a layered compound portion 75 made of a layered compound having a thickness of about 60 nm. The layered compound portion 75 was formed on the first electrode 60 in an island shape, as shown in FIGS. 9 and 10. The grains in a part of the piezoelectric layer 70 were increased in size, as shown in FIGS. 11B and 11E. The platinum first electrode 60 was preferentially oriented along the (111) plane, as shown in FIG. 11A, and the crystal grains b of the piezoelectric layer 70 were preferentially oriented along the (110) plane, as shown in FIG. 11B. Unlike the platinum first electrode preferentially oriented along the (111) plane, the layered compound portion 75 was preferentially oriented along the (001) plane, as shown in FIG. 11C. The crystal grains d and e (shown in FIGS. 11D and 11E) of the piezoelectric layer 70 present above the crystal grains b grew so as not to continue the orientation of the underlying layer. As shown in FIGS. 9 to 13B, the layered compound portion 75 was formed at the interface of the piezoelectric layer 70 with the first electrode 60, but was not formed in the middle in the thickness direction or the second electrode 80 side of the piezoelectric layer 70. In the layered compound portion 75, the direction perpendicular to the surface of the layer was defined as the c axis.

Examination 2

The scanning electron microscopy high-angle annular dark field (STEM-HAADF) and the Bi, Pt, Fe, Mn, Ba and Ti of the piezoelectric element of Example 1 were observed at a section along the thickness direction of the piezoelectric element by scanning transmission electron microscope-energy-dispersive spectroscopy (STEM-EDS). For the Bi, Pt and Ba, their L shells were observed. For the Fe, Mn, Ti and O, their K shells were observed. The results are shown in FIGS. 14A to 14H. As shown in these figures, the layered compound portion 75 contained Fe, Ba, Ti and O, and the amount of Fe was particularly large. The piezoelectric layer 70 contained Bi, Fe, Mn, Ba, Ti and O.

Examination 3

The piezoelectric layer 70 and the layered compound portion 75 of the piezoelectric element of Example 1 were observed by spherical aberration-corrected STEM (Cs-STEM). More specifically, Bi, which is a heavy element, was observed by Cs-STEM-EDS, and other elements Pt, Fe, Mn, Ba, Ti and O were observed by Cs-STEM electron energy-loss spectroscopy (Cs-STEM-EELS).

The Cs-STEM images of the piezoelectric layer 70 are shown in FIGS. 15A and 15B. FIG. 15A is an HAADF image, FIG. 15B is a BF image. FIG. 15C shows an intensity profile of the A and B sites of the perovskite structure. The upper right portions of FIGS. 15A and 15B show the respective enlargements. Cs-STEM spectrum imaging was performed on the elements Bi, Ba, Fe, Ti and O in the piezoelectric layer 70 by emitting an electron beam in the [100] direction. FIG. 16A shows the HAADF image; FIG. 16B shows the M shell image of the Bi element; FIG. 16C shows the M shell image of the Ba element; FIG. 16D shows the L shell image of the Fe element; FIG. 16E shows the L shell image of the Ti element; and FIG. 16F shows the K shell image of the O element.

Figure 17A:
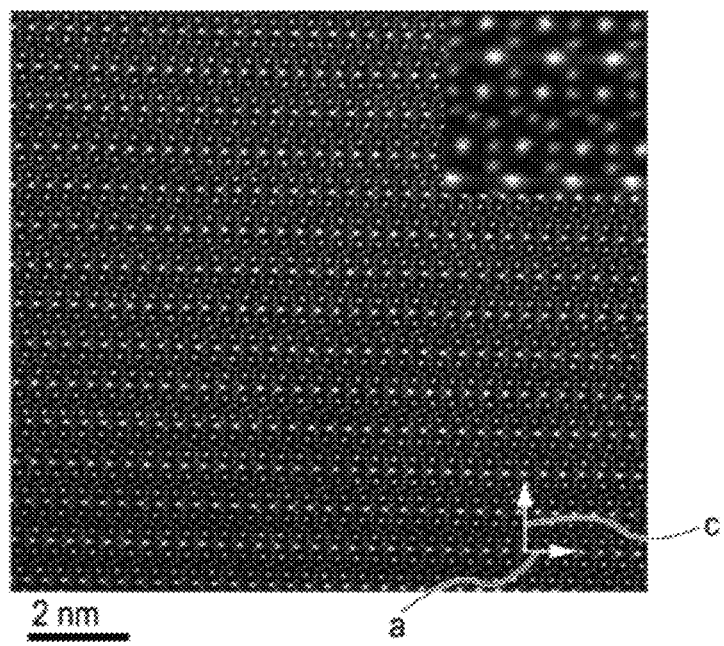
FIGS. 17A to 17C are Cs-STEM-BF image, an HAADF image and an electron diffraction image, respectively, of the layered compound portion of the piezoelectric element of Example 1.
Figure 17B:
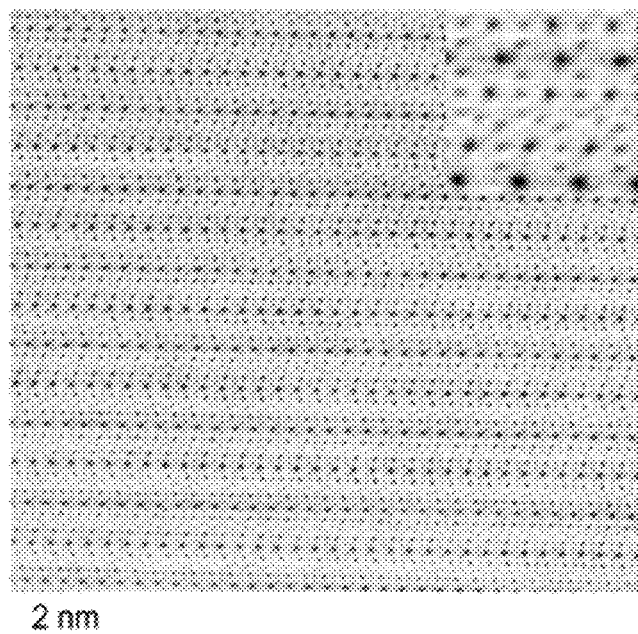
Figure 17C:
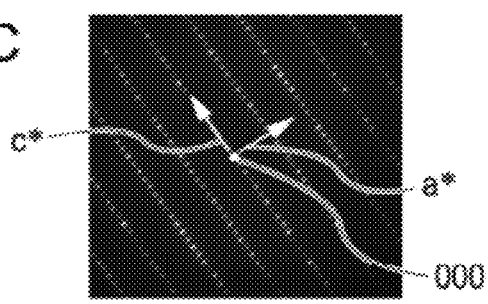

The layered compound portions 75 into which an electron beam was emitted in the [100] direction was observed by Cs-STEM. FIG. 17A shows the HAADF image, the FIG. 17B shows the BF image, and FIG. 17C shows the electron diffraction image. The upper right portions of FIGS. 17A and 17B show the respective enlargements. Furthermore, the atomic positions of the Ba, Fe, O and Ti in the layered compound portion 75 were investigated. FIGS. 18A and 18C show HAADF images of the layered compound portion 75; FIG. 18B shows the BF image; FIG. 18D shows Ba atomic positions; FIG. 18E shows Fe atomic positions; FIG. 18E shows Fe atomic positions; FIG. 18F shows O atomic positions; and FIG. 18G shows Ti atomic positions. FIG. 18B shows the positions of Fe, Ti and Ba.

As shown in FIGS. 17A to 18G, the layered compound portion 75 has a different structure from the piezoelectric layer 70, and which contains Ba, Fe, Ti and O and includes planar crystal layers. The piezoelectric layer 70 had a perovskite structure whose A site contained Ba and Bi, and whose B site contained Ti and Fe.

Examination 4

The piezoelectric element of Example 1 was subjected to powder X-ray diffraction analysis to obtain the diffraction pattern of the piezoelectric layer with D8 Discover (manufactured by Bruker AXS) using CuKα rays at room temperature. As a result, a peak representing a perovskite structure was observed.

Examination 5

Figure 19A:
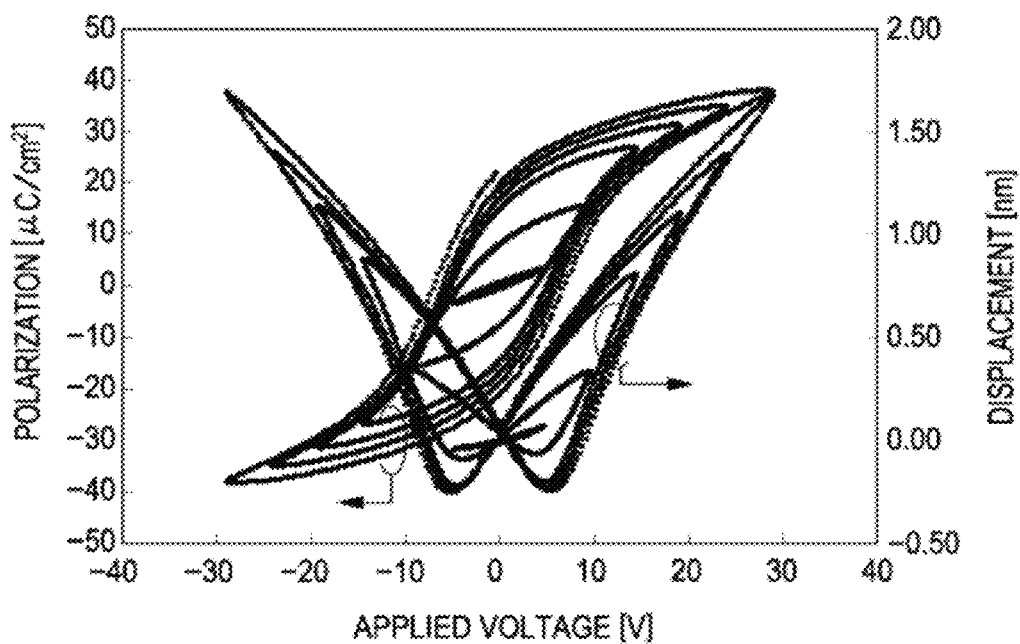
FIGS. 19A and 19B are a P-V curve and an S-V curve, respectively, of the piezoelectric element of Example 1.
Figure 19B:
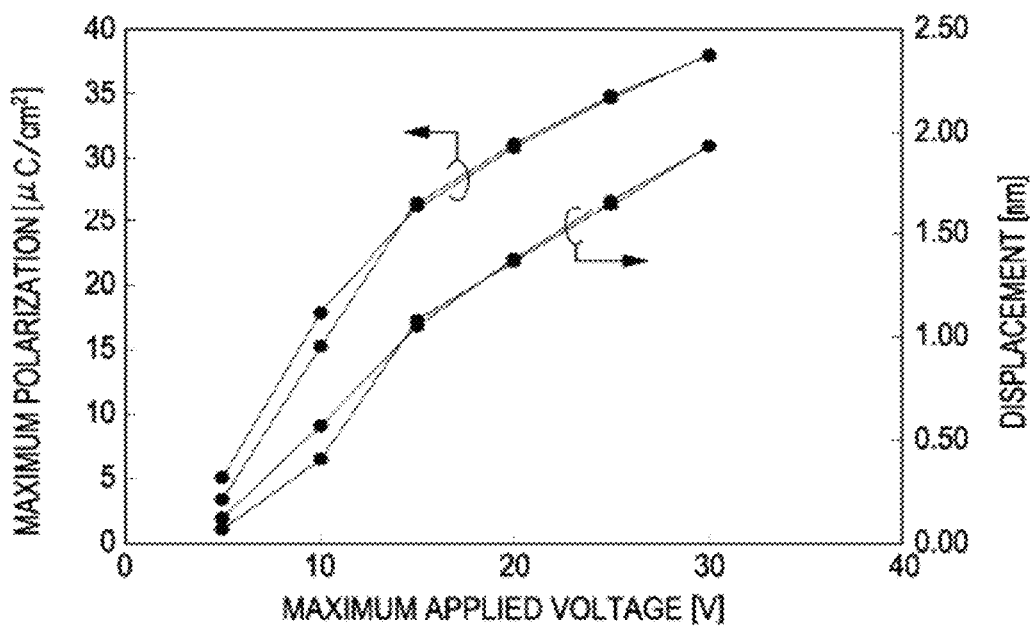

The relationship between the polarization and the voltage (P-V curves) of the piezoelectric element of Example 1 was obtained with a tester FCE-1A (manufactured by TOYO) by applying triangular waves of 1 kHz in frequency using an electrode pattern having a diameter of 400 μm. The result is shown in FIG. 19A. FIG. 19B shows the relationship between the maximum polarization $P_{max}$ and the maximum applied voltage. It was shown that the piezoelectric layer of Example 1 was ferroelectric.

The relationships between the electric field-induced distortion (displacement) and the voltage (S-V curve) of the piezoelectric element of Example 1 was obtained at room temperature with a double-beam laser interferometer (DBLI) manufactured by aixACCT by applying a voltage of 1 kHz in frequency using an electrode pattern having a diameter of 500 μm. The result is shown in FIG. 19A. FIG. 19B shows the relationship between the displacement dpp2 and the maximum voltage applied. As a result, the piezoelectric element of Example 1 exhibited a displacement sufficient for a liquid ejecting head.

Example 2

A piezoelectric element including a 651 nm thick piezoelectric layer 70 was produced in the same manner as in Example 1, except that the firing temperature was reduced to 750° C. from 800° C.

Examination 6

Figure 20:
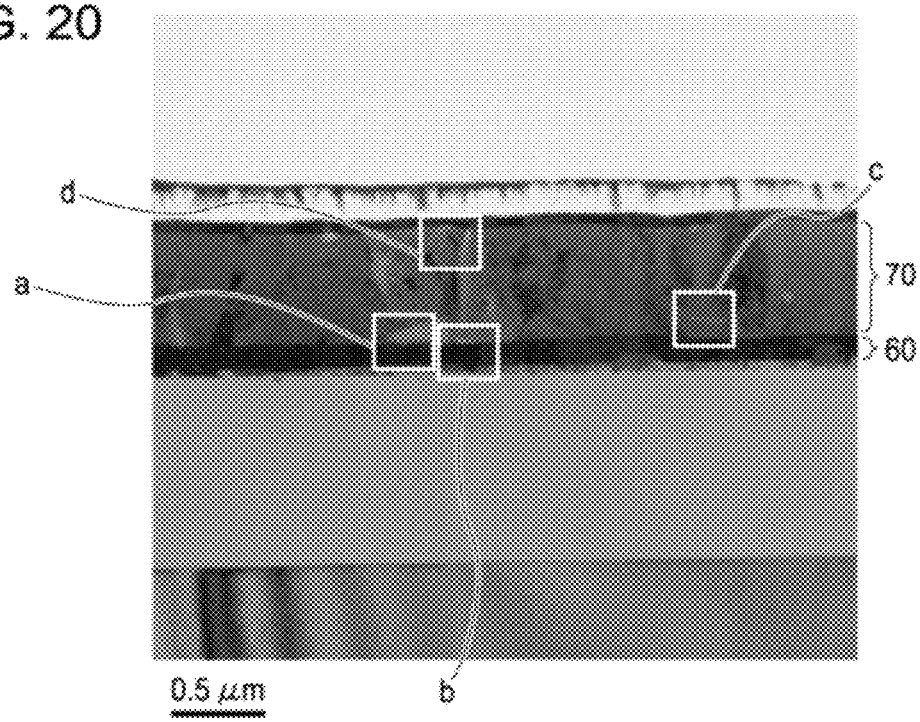
FIG. 20 is an EFTEM-BF image of a piezoelectric element of Example 2.
Figure 21:
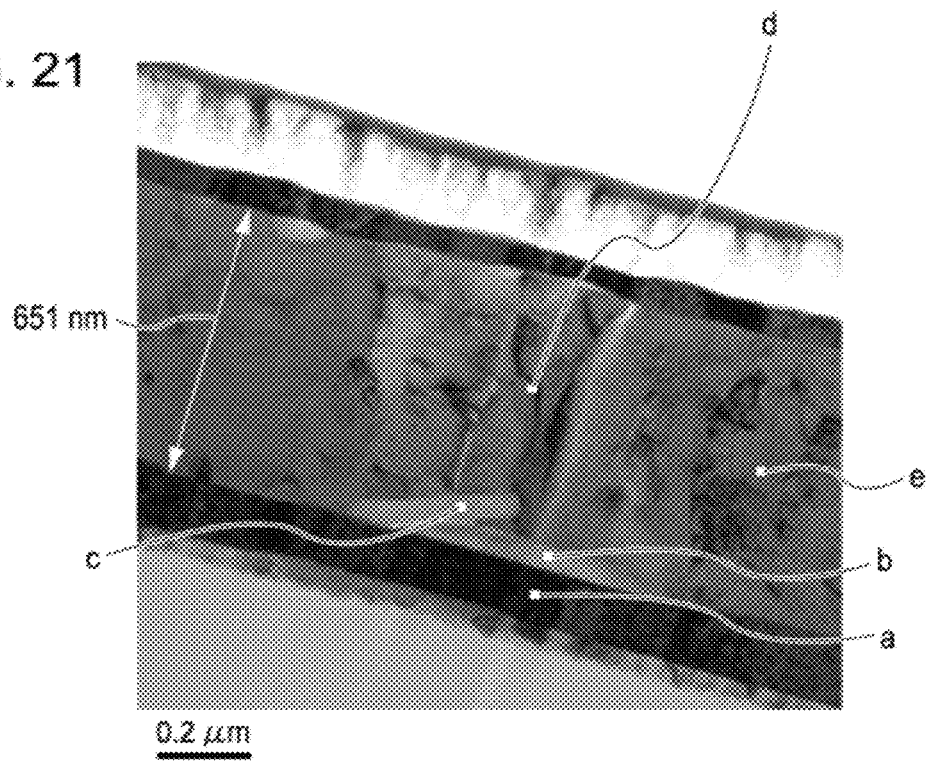
FIG. 21 is an enlargement of the EFTEM-BF image of the piezoelectric element of Example 2.

A section along the thickness direction of the piezoelectric element of Example 2 was observed by EFTEM in the same manner as in Examination 1. The EFTEM-BF image obtained is shown in FIG. 20. Also, FIG. 21 shows an enlargement of a part of FIG. 20. FIGS. 22A to 22E are electron diffraction images of the points a to e indicated by the square dots shown in FIG. 21, respectively. The enlargements of portions a to d surrounded by the square lines in FIG. 20 are shown in FIGS. 23A (portion a) and 23B (portion b) and FIGS. 24A (portion c) and 24B (portion d), respectively.

Figure 22A:
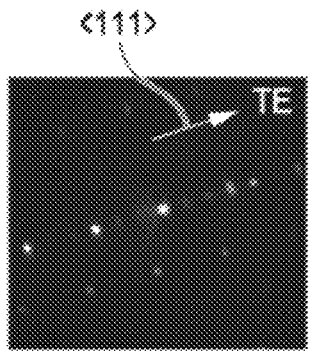
FIGS. 22A to 22E are electron diffraction images of the piezoelectric element of Example 2.
Figure 22B:
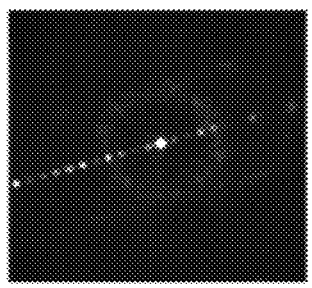
Figure 22C:
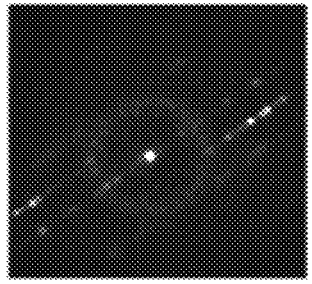
Figure 22D:
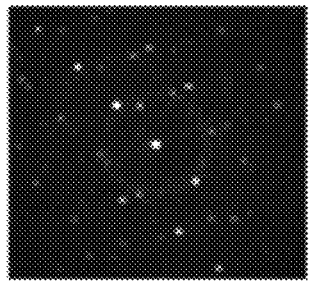
Figure 22E:
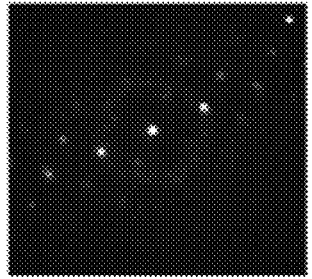
Figure 23A:
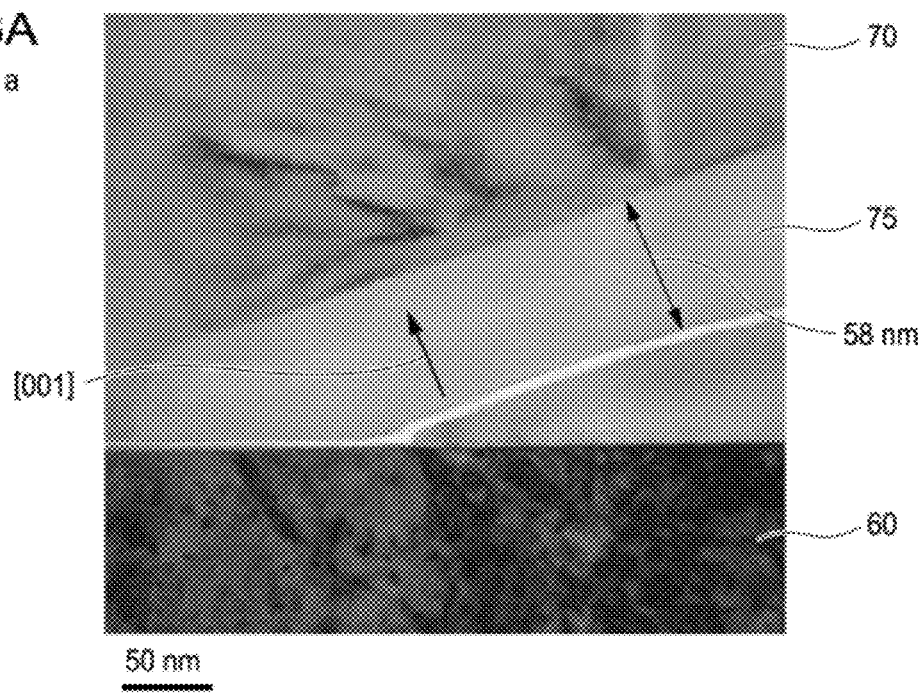
FIGS. 23A and 23B are enlarged EFTEM-BF images of the piezoelectric element of Example 2.
Figure 23B:
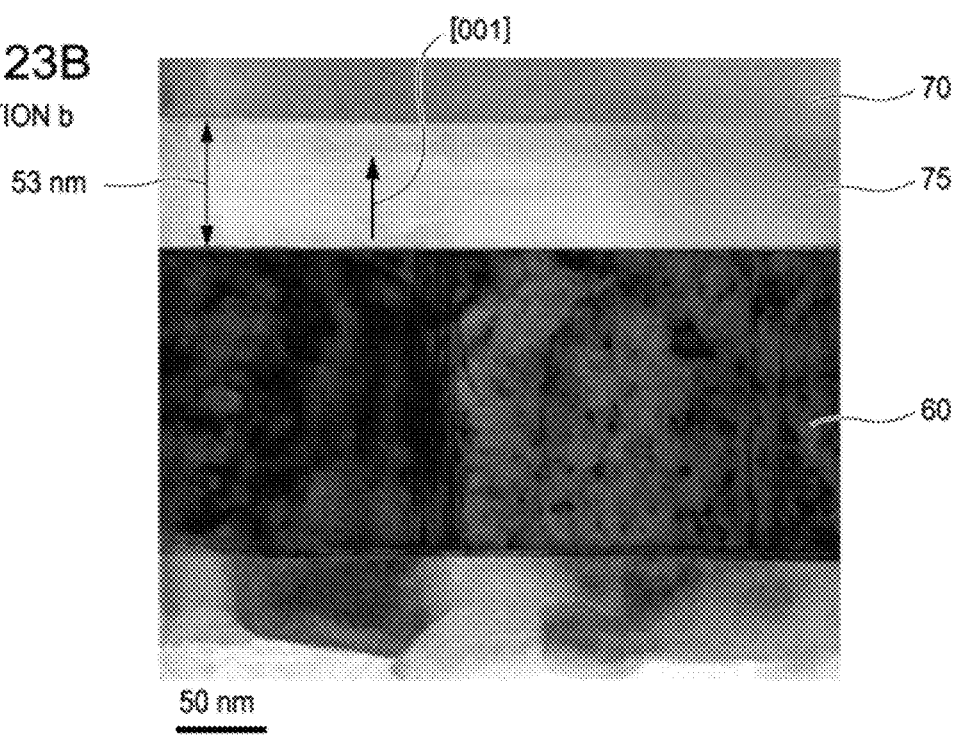
Figure 24A:
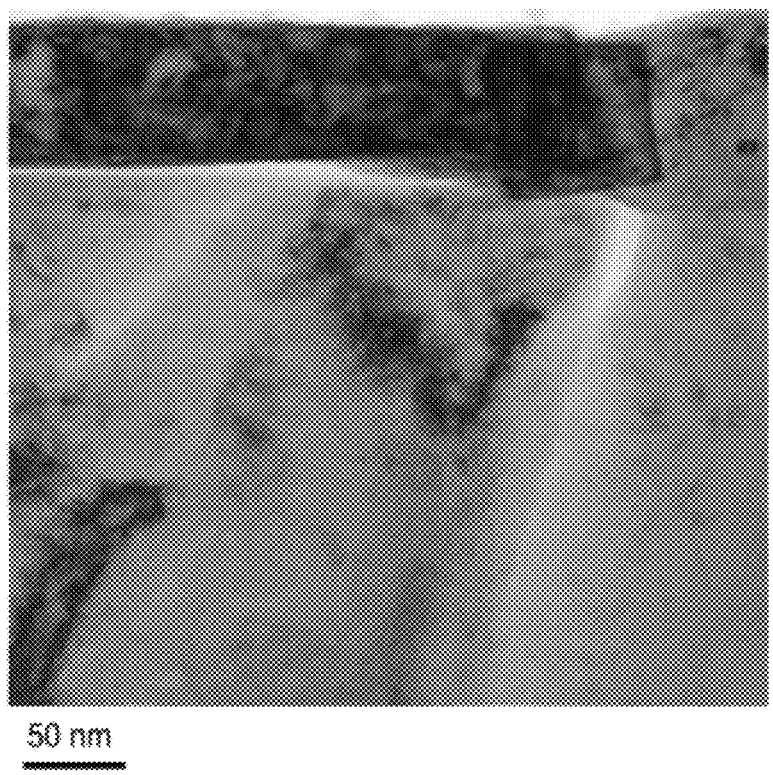
FIGS. 24A and 24B are enlarged EFTEM-BF images of the piezoelectric element of Example 2.
Figure 24B:
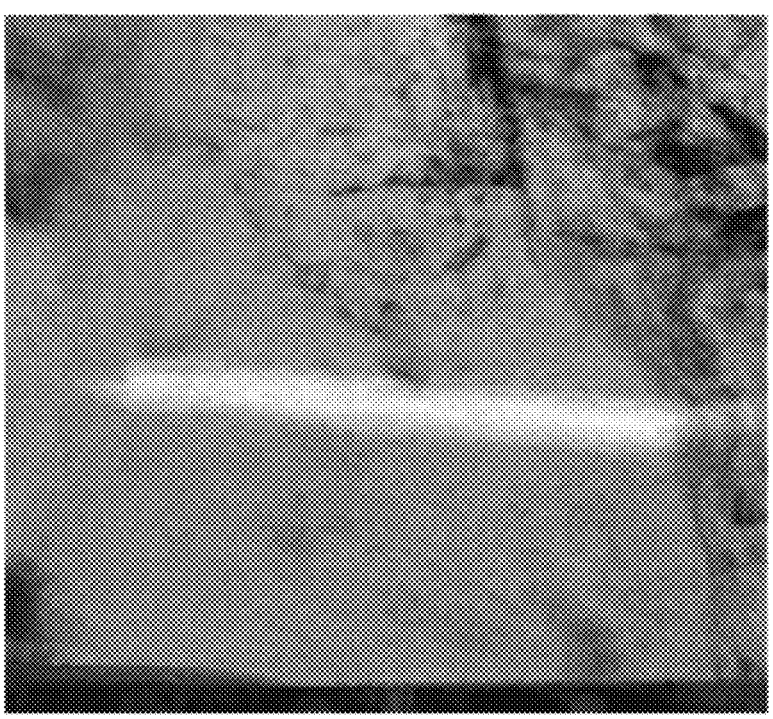

As shown in FIGS. 23A and 23B, a pattern of a layer was observed between the piezoelectric layer 70 and the first electrode 60, and it was a layered compound portion 75 made of a layered compound having a thickness of about 50 to 60 nm. The layered compound portion 75 was formed on the first electrode 60 in an island shape, as shown in FIGS. 20 and 21. The platinum first electrode 60 was preferentially oriented along the (111) plane, as shown in FIG. 22A. Unlike the platinum first electrode preferentially oriented along the (111) plane, the layered compound portion 75 was preferentially oriented along the (001) plane, as shown in FIG. 22B. The portion d (FIG. 22D) of the piezoelectric layer 70 and the portion e (FIG. 22E) of the piezoelectric layer 70 grew so as not to continue the orientation of the underlying layer. As shown in FIGS. 20 to 24D, the layered compound portion 75 was formed at the interface of the piezoelectric layer 70 with the first electrode 60, but was not formed in the middle in the thickness direction or the second electrode 80 side, of the piezoelectric layer 70.

Examination 7

A section along the thickness direction of the piezoelectric element of Example 2 was observed in the same manner as in Examination 2. More specifically, the Bi, Pt, Fe, Mn, Ba, Ti and O elements were observed by STEM-EDS. The results are shown in FIGS. 25A to 25H. As shown in these figures, the layered compound portion 75 contained Fe, Mn, Ba, Ti and O, and the amount of Fe was particularly large. The piezoelectric layer 70 contained Bi, Fe, Mn, Ba, Ti and O.

Examination 8

The powder X-ray diffraction pattern of the piezoelectric layer of the piezoelectric element of Example 2 was obtained in the same manner as in Examination 4. As a result, a peak representing a perovskite structure was observed.

Examination 9

Figure 26A:
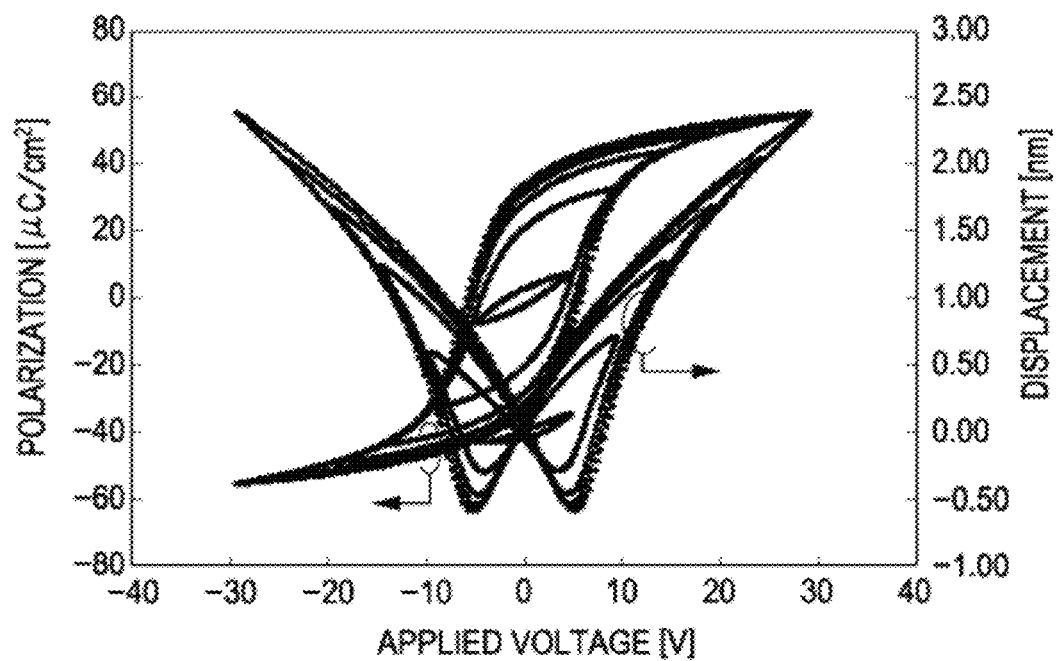
FIGS. 26A and 26B are a P-V curve and an S-V curve, respectively, of the piezoelectric element of Example 2.
Figure 26B:
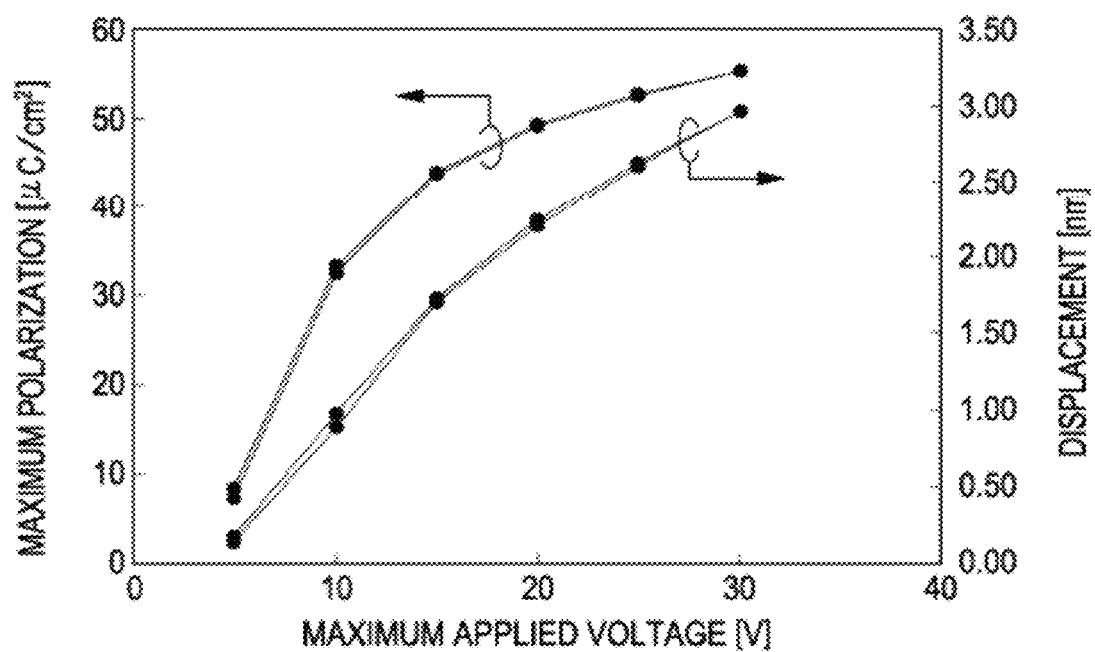

The piezoelectric element of Example 2 was investigated in the same manner as in Examination 5 for the relationship between the polarization P and the voltage V, the relationship between the maximum polarization $P_{max}$ and the maximum applied voltage, the relationship between the field-induced distortion S (displacement) and the voltage V, and the relationship between the displacement dpp2 and the maximum applied voltage. The results are shown in FIGS. 26A and 26B. It was shown that the piezoelectric layer of Example 2 was ferroelectric. In addition, the piezoelectric element of Example 2 exhibited a degree of displacement sufficient for a liquid ejecting head.

Example 3

In the same manner as in Example 1, a 1200 nm thick silicon dioxide film was formed on the surface of a (100)-oriented monocrystalline silicon substrate by thermal oxidation, and then a titanium oxide film and a first electrode 60 were formed.

In the present Example, a precursor solution was prepared by mixing bismuth nitrate, sodium acetate, barium acetate and titanium isopropoxide in n-butanol in a proportion of Bi:Fe:Mn:Ba:Ti=0.75:0.7125:0.0375:0.25:0.25 on a mole basis.

The precursor solution was dropped onto the surface of the substrate on which the titanium oxide film and the first electrode 60 had been formed, and was then subjected to spin coating at a speed of 3000 rpm, thus forming a piezoelectric precursor film (coating). Then, the piezoelectric precursor film on the substrate was dried on a hot plate at 180° C. for 2 minutes (drying). The piezoelectric precursor film was further subjected to degreasing on a hot plate at 450° C. for 2 minutes (degreasing). The sequence of the operations of coating, drying and degreasing was repeated twice, and, then, the resulting precursor film was fired at 750° C. for 5 minutes in an oxygen atmosphere by RTA (firing).

Subsequently, a sequence performing two sequences of the operations of coating, drying and degreasing and then performing the firing operation was performed four times. Thus, a piezoelectric layer 70 was formed to a thickness of 841 nm by 10 coating operations in total. Then, a platinum film having a diameter of 500 μm and a thickness of 100 nm was formed as second electrodes 80 on the piezoelectric layer 70 by DC sputtering, and was then fired at 750° C. for 5 minutes by RTA to complete a piezoelectric element.

Example 4

The operations of coating, drying and degreasing were performed using the same coating solution as in Example 3. The resulting coating was fired at 750° C. for 5 minutes in an oxygen atmosphere by RTA (firing).

Subsequently, a sequence of the operations of coating, drying, degreasing and firing was repeated in the same manner. Thus a piezoelectric layer 70 was formed by two coating operations in total.

Example 5

The operations of coating, drying and degreasing were performed in the same manner as in Example 3. After the sequence of the operations of coating, drying and degreasing, firing operation was performed at 750° C. for 5 minutes in an oxygen atmosphere by RTA (firing).

Subsequently, the sequence of the operations of coating, drying, degreasing and firing was repeated, and, then, a sequence of operations of coating, drying and the degreasing was performed twice, followed by firing. Thus, a piezoelectric layer 70 was formed by 4 coating operations in total.

Examination 10

Sections along the thickness direction of the piezoelectric elements of Examples 4 and 5 were observed by STEM-EDS in the same manner as in Examination 2. The elemental distribution images obtained by STEM-EDS are shown in FIGS. 27A to 28H.

In the piezoelectric element of Example 5, which had been subjected to three firing operations, each performed at 750° C. for 5 minutes, Bi was diffused to a region under the first electrode, as shown in FIG. 28B. On the other hand, in the piezoelectric element of Example 4, which had been subjected to two firing operations, each performed at 750° C. for 5 minutes, a very small amount of Bi was diffused, as shown in FIG. 27B. These results show that the degree of Bi diffusion is increased in proportion to the quantity of heat for firing operation. Also, in the piezoelectric element of Example 1, which had been subjected to five firing operations, each performed at 800° C. for 5 minutes, and a single firing operation at 750° C. for 5 minutes, Bi was diffused widely, as clearly shown in FIG. 25B.

In the piezoelectric element of Example 4, which had been subjected to two firing operations, each performed at 750° C. for 5 minutes, and the piezoelectric element of Example 5, which had been subjected to three firing operations, each performed at 750° C. for 5 minutes, a much smaller layered compound portion 75 than that of shown in FIGS. 25A to 25H, containing Fe, Ba, Ti and O is observed in FIGS. 27A to 28H. In FIGS. 27A to 28H, however, it is no more than seed crystals of a layered compound. It is expected that by further applying heat to such a layered compound portion, the layered compound portion is grown, as well as diffusing Bi. Thus, it is expected that the layered compound portion can be formed easily under conditions facilitating Bi diffusion.

Example 6

The operations of coating, drying and degreasing were performed in the same manner as in Example 3. The sequence of the operations of coating, drying and degreasing was repeated twice, and, then, firing was performed at 750° C. for 5 minutes in an oxygen atmosphere by RTA (firing).

Example 7

The operations of coating, drying and degreasing were performed in the same manner as in Example 3. The sequence of the operations of coating, drying and degreasing was repeated twice, and, then, firing was performed at 700° C. for 5 minutes in an oxygen atmosphere by RTA (firing).

Example 8

The operations of coating, drying and degreasing were performed in the same manner as in Example 3. The sequence of the operations of coating, drying and degreasing was repeated twice, and, then, firing was performed at 650° C. for 5 minutes in an oxygen atmosphere by RTA (firing).
Examination 11

Figure 29:
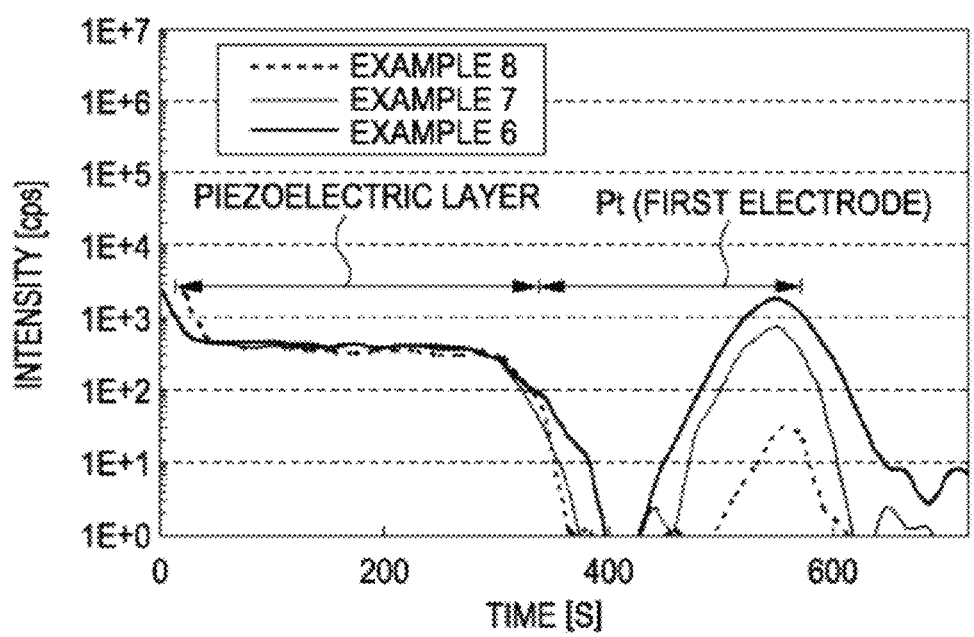
FIG. 29 is a plot showing Bi compositional profiles along the depth of the piezoelectric elements of Examples 6 to 8 measured by SIMS.
Figure 30:
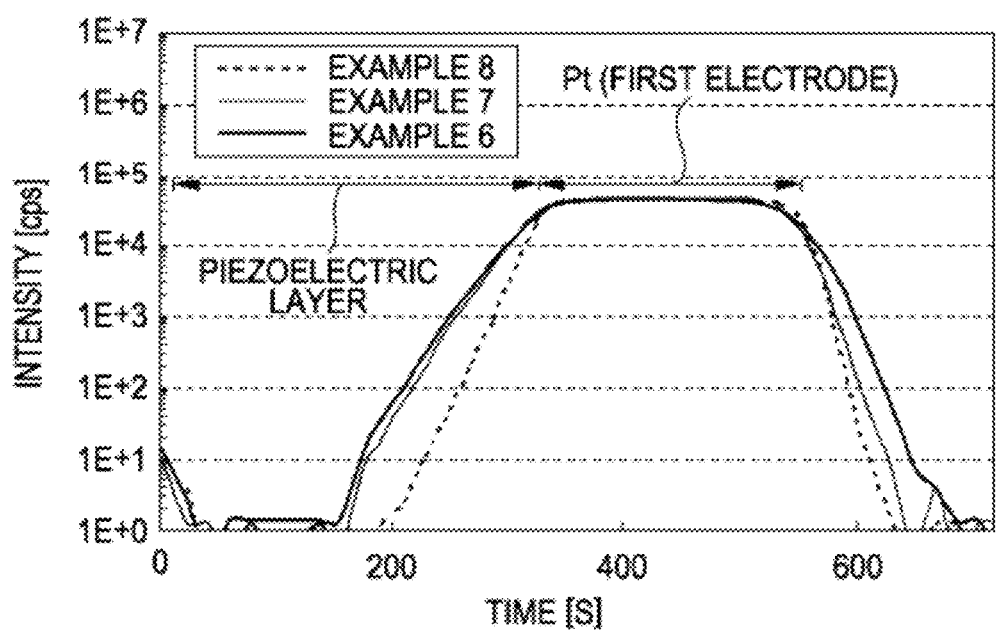
FIG. 30 is a plot showing Pt compositional profiles along the depth of the piezoelectric elements of Examples 6 to 8 measured by SIMS.

The compositional profiles along the depth of the piezoelectric elements of Examples 6 to 8 were measured with a secondary ion mass spectrometer (SIMS) IMS-7f manufactured by CAMECA. The results are shown in FIGS. 29 and 30. FIG. 29 shows Bi profiles normalized to $133Cs_2$, and FIG. 30 shows Pt profiles.

These figures show that the Pt first electrode is present at a depth corresponding to about 300 to 550 seconds, and that a large amount of Bi is diffused under the first electrode in Examples 6 and 7 while Bi diffusion is small in Example 8. It is therefore supposed that in Examples 6 and 7, a layered compound portion containing Fe, Ba, Ti and O grew between the first electrode and the piezoelectric layer, and that in Example 8 the growth of such a layered compound portion was small.

From the above results, it has been found that the diffusion of Bi is significantly affected by the time and temperature of crystallization, that is, the heat quantity applied for crystallization, and that the heat quantity is involved in the formation of the layered compound portion. From the results including those in Examination 10, it has been also found that the degree of Bi diffusion to a region under the first electrode is increased by increasing the heat quantity applied to the piezoelectric element (Examples 4 and 5), and, thus, seed crystals of a layered compound (Examples 4 and 5) are formed. In addition, if the heat quantity is further increased, Bi is segregated under the first electrode under the seed crystals of the layered compound, thus growing the layered compound (Example 2).

Other Embodiments

Although an exemplary embodiment of the invention has been described, the invention is not limited to the disclosed embodiment. For example, in the above embodiment, a monocrystalline silicon substrate is used as the flow channel substrate 10. However, the flow channel substrate 10 may be made of, for example, silicon-on-insulator (SOI) or glass, without particular limitation.

Also, although the piezoelectric element 300 of the above embodiment includes the first electrode 60, the piezoelectric layer 70 and the second electrode 80 that are stacked in that order on a substrate (flow channel substrate 10), the structure of the piezoelectric element is not limited to this structure. For example, an embodiment of the invention can be applied to a vertical vibration piezoelectric element including layers of a piezoelectric material and an electrode material alternately formed so as to expand and contract in the axis direction.

Figure 31:
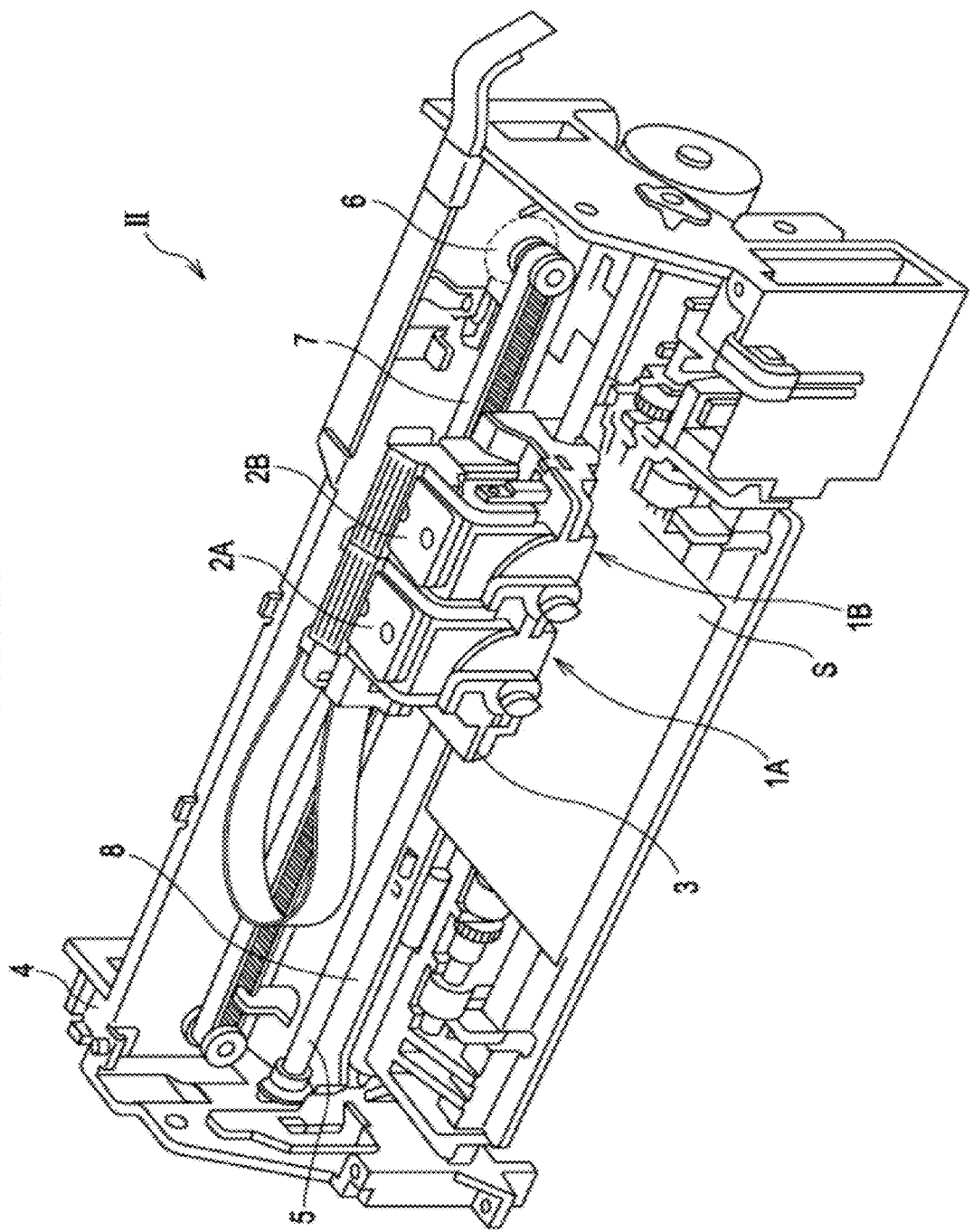
FIG. 31 is a schematic view of a recording apparatus according to an embodiment of the invention.

The ink jet recording head according to an embodiment of the invention can be installed in an ink jet recording apparatus to serve as a part of a recording head unit including flow channels communicating with an ink cartridge or the like. FIG. 31 is a schematic perspective view of such an ink jet recording apparatus.

The ink jet recording apparatus II shown in FIG. 31 includes recording head units 1A and 1B each including the ink jet recording head I. Cartridges 2A and 2B for supplying ink are mounted in the respective recoding head units 1A and 1B. The recording head units 1A and 1B are loaded on a carriage 3 secured for movement along a carriage shaft 5 of an apparatus body 4. The recording head units 1A and 1B eject, for example, a black ink composition and a color ink composition, respectively.

The carriage 3 on which the recording head units 1A and 1B are mounted is moved along the carriage shaft 5 by transmitting a driving force from a driving motor 6 to the carriage 3 through a plurality of gears (not shown) and a timing belt 7. In the apparatus body 4, a platen 8 is disposed along the carriage shaft 5 so that a recording sheet S, which is a print medium such as paper, fed from, for example, a feed roller (not shown) is transported over the platen 8.

Although the above embodiment has described an ink jet recording head as the liquid ejecting head, the invention is intended for any type of liquid ejecting head, and may be applied to other liquid ejecting heads ejecting liquid other than ink. Other liquid ejecting heads include various types of recording head used in image recording apparatuses such as printers, color material ejecting heads used for manufacturing color filters of liquid crystal displays or the like, electrode material ejecting heads used for forming electrodes of organic EL displays or field emission displays (FEDs), and bioorganic material ejecting heads used for manufacturing biochips.

The piezoelectric elements according to embodiments of the invention can be used in other equipment, for example, ultrasonic wave devices such as ultrasonic oscillators and ultrasonic motors, piezoelectric sensors that detect deformation of the piezoelectric layer as electrical signals, pressure sensors, and pyroelectric sensors such as IR sensors, without being limited to the use in liquid ejecting heads represented by an ink jet recording head. Also, the piezoelectric element according to an embodiment of the invention may be applied to a ferroelectric element of a ferroelectric memory device or the like.

What is claimed is:

1. A piezoelectric element comprising:
   a first electrode;
   a second electrode; and
   a layered compound; and
   a piezoelectric layer made of a complex oxide having a perovskite structure containing at least bismuth, barium, iron, and titanium;
   wherein the layered compound contains iron, barium, titanium and oxygen and is formed between the piezoelectric layer and the first electrode and
   wherein the piezoelectric layer is formed between the layered compound and the second electrode, and
   wherein the layered compound is preferentially oriented along the (001) plane.

2. The piezoelectric element according to claim 1, wherein the layered compound is formed in an island shape.

3. The piezoelectric element according to claim 1, wherein the layered compound further contains manganese.

4. A liquid ejecting head comprising the piezoelectric element as set forth in claim 1.

5. A liquid ejecting apparatus comprising the liquid ejecting head as set forth in claim 4.

6. A method for forming the piezoelectric element of claim 1, comprising firing the piezoelectric element at a firing temperature greater than 650° C.

7. A method for forming a piezoelectric element, the method comprising:
   forming a first electrode;
   forming a layered compound on the first electrode, the layered compound containing iron, barium, titanium and oxygen;
   forming a piezoelectric layer on the layered compound, wherein the piezoelectric layer is made of a complex oxide having a perovskite structure containing at least bismuth, barium, iron, and titanium;
   forming a second electrode on the piezoelectric layer; and
   firing at a temperature greater than 650° C.

8. The method of claim 7, further comprising forming the layered compound in an island shape, wherein at least some of the piezoelectric layer contacts the first electrode.

* * * * *